US008133653B2

(12) United States Patent
Shimbori et al.

(10) Patent No.: US 8,133,653 B2
(45) Date of Patent: Mar. 13, 2012

(54) POSITIVE RESIST COMPOSITION FOR FORMING THICK-FILM RESIST, THICK-FILM RESIST LAMINATE, AND METHOD OF FORMING RESIST PATTERN

(75) Inventors: Hiroshi Shimbori, Kawasaki (JP); Masahiro Masujima, Kawasaki (JP); Toshihiro Yamaguchi, Kawasaki (JP); Sachiko Yoshizawa, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 403 days.

(21) Appl. No.: 12/162,775

(22) PCT Filed: Jan. 31, 2007

(86) PCT No.: PCT/JP2007/051589
§ 371 (c)(1),
(2), (4) Date: Jul. 30, 2008

(87) PCT Pub. No.: WO2007/088884
PCT Pub. Date: Aug. 9, 2007

(65) Prior Publication Data
US 2009/0023102 A1   Jan. 22, 2009

(30) Foreign Application Priority Data
Feb. 2, 2006   (JP) ................................. 2006-025770

(51) Int. Cl.
*G03F 7/028* (2006.01)
*G03F 7/039* (2006.01)
*G03F 7/26* (2006.01)

(52) U.S. Cl. ..................... 430/270.1; 430/326; 430/921; 430/925

(58) Field of Classification Search ............... 430/270.1, 430/326, 908, 910, 921, 925
See application file for complete search history.

(56) References Cited

U.S. PATENT DOCUMENTS

| 5,362,600 A * | 11/1994 | Sinta et al. ..................... 430/192 |
| 5,876,900 A * | 3/1999 | Watanabe et al. ........... 430/288.1 |
| 5,939,235 A | 8/1999 | Kondo et al. |
| 5,945,517 A | 8/1999 | Nitta et al. |
| 6,120,972 A | 9/2000 | Iwanaga et al. |
| 6,153,733 A | 11/2000 | Yukawa et al. |
| 6,358,665 B1 * | 3/2002 | Pawlowski et al. ......... 430/270.1 |
| 6,641,972 B2 | 11/2003 | Misumi et al. |
| 6,641,975 B2 * | 11/2003 | Takeda et al. .............. 430/270.1 |
| 2003/0060055 A1 | 3/2003 | Kamijima |
| 2003/0152865 A1 | 8/2003 | Oomori et al. |
| 2006/0194140 A1 | 8/2006 | Shimbori |
| 2006/0246373 A1 * | 11/2006 | Wang ......................... 430/270.1 |
| 2007/0015080 A1 * | 1/2007 | Toukhy et al. ............. 430/270.1 |
| 2008/0044764 A1 | 2/2008 | Takahashi et al. |

FOREIGN PATENT DOCUMENTS

| JP | H 06-148889 | 5/1994 |
| JP | H06-230574 | 8/1994 |
| JP | H09-208554 | 8/1997 |
| JP | H11-035551 | 2/1999 |
| JP | H11-035552 | 2/1999 |
| JP | H11-035573 | 2/1999 |
| JP | 11-072920 | 3/1999 |
| JP | 11-143079 | 5/1999 |
| JP | 11-305441 | 11/1999 |
| JP | H11-322707 | 11/1999 |
| JP | 2001-166478 | 6/2001 |
| JP | 2002-110536 | 4/2002 |
| JP | 2002-258479 | 9/2002 |
| JP | 2002-341538 | 11/2002 |
| JP | 2004-302434 | 10/2004 |
| JP | 2005-181976 | 7/2005 |
| JP | 2006-003861 | 1/2006 |
| JP | 2006-018015 | 1/2006 |
| JP | 2006-018017 | 1/2006 |
| WO | WO 2004/074242 | 9/2004 |

OTHER PUBLICATIONS

International Search Report in connection with corresponding PCT application No. PCT/JP2007/051589, dated Feb. 20, 2007.
Office Action issued in counterpart Korean Patent Application No. 10-2008-7019840, dated Sep. 13, 2010.

* cited by examiner

*Primary Examiner* — Anca Eoff
(74) *Attorney, Agent, or Firm* — Knobbe Martens Olson & Bear LLP

(57) ABSTRACT

A positive resist composition for forming a thick-film resist having a film thickness of 1 to 15 μm, the composition comprising: a resin component (A) that includes a polymer compound (A1), which has a weight average molecular weight of 20,000 to 50,000, and includes a structural unit (a1) derived from a hydroxystyrene and a structural unit (a2) derived from an acrylate ester containing an acid dissociable, dissolution inhibiting group, an acid generator component (B) that generates acid upon exposure and includes an onium salt-based acid generator having an anion moiety represented by general formula (I): $R^{4\prime\prime}SO_3^-$ (wherein, $R^{4\prime\prime}$ represents a linear or branched alkyl group or fluoroalkyl group of 4 carbon atoms), and a nitrogen-containing organic compound (D) that includes a tertiary aliphatic amine.

4 Claims, 1 Drawing Sheet

POSITIVE RESIST COMPOSITION FOR FORMING THICK-FILM RESIST, THICK-FILM RESIST LAMINATE, AND METHOD OF FORMING RESIST PATTERN

RELATED APPLICATIONS

This application is the U.S. National Phase filing under 35 U.S.C. §371 of PCT/JP2007/051589, filed Jan. 31, 2007, which designated the United States and was published in a language other than English, which claims priority under 35 U.S.C. §119(a)-(d) to Japanese Patent Application No. 2006-025770, filed Feb. 2, 2006. The content of these applications is incorporated herein by reference in their entireties.

TECHNICAL FIELD

The present invention relates to a positive resist composition for forming a thick-film resist, a thick-film resist laminate, and a method of forming a resist pattern.

BACKGROUND ART

Photolithography techniques include processes in which, for example, a resist film composed of a resist composition is formed on top of a substrate, the resist film is selectively irradiated with light or an electron beam or the like, through a photomask in which a predetermined pattern has been formed, and a developing treatment is then conducted, thereby forming a resist pattern of the prescribed shape in the resist film. Resist compositions in which the exposed portions change to become soluble in the developing liquid are termed positive compositions, whereas resist compositions in which the exposed portions change to become insoluble in the developing liquid are termed negative compositions.

In recent years, in the production of semiconductor elements and liquid crystal display elements, advances in lithography techniques have lead to rapid progress in the field of miniaturization. These miniaturization techniques generally involve shortening the wavelength of the exposure light. Conventionally, ultraviolet radiation typified by g-line and i-line radiation has been used, but nowadays KrF excimer lasers (248 nm) have been introduced, and ArF excimer lasers (193 nm) are now also starting to be introduced. Further, investigations are also being conducted into the use of even shorter wavelengths such as $F_2$ excimer lasers (157 nm), extreme ultra violet radiation (EUV), electron beams, and X-rays and the like.

Furthermore, in order to reproduce patterns of very fine dimensions, resist materials with high resolution are required. Chemically amplified resist compositions, which contain a base resin and an acid generator that generates acid upon exposure, are used as these types of resist materials.

For example, a positive chemically amplified resist includes a resin component that exhibits increased alkali solubility under the action of acid and an acid generator component that generates acid upon exposure, and during resist pattern formation, when acid is generated from the acid generator as a result of exposure, the exposed portions become alkali-soluble.

As the resin component of the chemically amplified positive resist composition, a polyhydroxysyene (PHS) based resin in which the hydroxyl groups have been protected with acid dissociable, dissolution inhibiting groups, or a resin having structural units derived from (meth)acrylic acid within the principal chain (namely, an acrylic-based resin) in which the carboxyl groups have been protected with acid dissociable, dissolution inhibiting groups is generally used.

Examples of the acid dissociable, dissolution inhibiting groups include so-called acetal groups, such as chain-like ether groups typified by 1-ethoxyethyl groups, and cyclic ether groups typified by tetrahydropyranyl groups; tertiary alkyl groups typified by tert-butyl groups; and tertiary alkoxycarbonyl groups typified by tert-butoxycarbonyl groups (for example) see patent document 1).

During the production of semiconductor elements and the like, the resist films formed using resist compositions are usually thin films having a film thickness of approximately 100 to 800 nm, although resist compositions are also used for forming films of greater thickness, for example, in the formation of thick-film resists having film thicknesses of 1 μm or greater.

For example, when mounting LSI (Large Scale Integration) within electronic machinery, a thick-film resist is used in a multi-pin thin-film mounting process used for providing connection terminals composed of protruding electrodes on the upper surface of a support such as a substrate, wherein the thick-film resist is used for forming connection terminals composed of bumps that protrude from the support, or for forming connection terminals formed from a support pillar known as a metal post that protrudes from the support, and a solder ball that is formed on top of the metal post. In a specific example, these connection terminals can be formed by forming a thick-film resist on top of a support, exposing the resist through a predetermined mask pattern and then developing the resist to form a resist pattern in which the portions in which the bumps or metal posts are to be formed have been removed (stripped), filling these removed portions (resist-free portions) with a plating of a conductor such as copper, gold, nickel or solder, and then removing the surrounding resist pattern.

Examples of known resist compositions used for applications such as the formation of the above thick-film resists include positive photosensitive resin compositions containing a quinonediazide group-containing compound, which are used for forming bumps or wiring (for example, see patent document 2).

Resist patterns formed in the manner described above can be used for plating processes in which the resist pattern is used as a frame, and also for etching processes and high-energy implantation processes and the like in which the resist pattern is used as a mask. Accordingly, the resist patterns can be used in the production of MEMS (Micro Electro Mechanical Systems) in which the types of processes described above are performed.

MEMS are highly advanced micro systems in which micromachining techniques are used to integrate a variety of microstructures (including functional elements such as sensors, and conducting structures such as wiring and connection terminals) on top of a support. For example, patent document 3 discloses a method of producing a micro-device such as a magnetic head using a resist pattern of a specific shape formed using a positive resist composition containing a novolak resin.

[Patent Document 1] Japanese Unexamined Patent Application, First Publication No. 2002-341538
[Patent Document 2] Japanese Unexamined Patent Application, First Publication No. 2002-258479
[Patent Document 3] Japanese Unexamined Patent Application, First Publication No. 2002-110536

DISCLOSURE OF INVENTION

Problems to be Solved by the Invention

Nowadays, the demands for increased miniaturization continue to grow. For example, increasing the recording density of magnetic recording media requires the miniaturization of the magnetic surface area that can be formed within a magnetic recording medium, and achieving this type of miniaturization of the magnetic surface area requires the formation of a very fine resist pattern, thereby enabling the formation of a very fine magnetic film pattern.

However, with conventional non-chemically amplified positive resist compositions such as those described within the patent documents 2 and 3, adequate microfabrication cannot be achieved, and forming a very fine resist pattern such as a resist pattern with dimensions of not more than 400 nm is problematic.

The use of chemically amplified positive resist compositions such as those used in the production of semiconductor elements and the like has also been considered. However, with the types of conventional chemically amplified positive resist compositions described above, the rectangular formability is poor, with problems including poor verticalness of the side walls of the resist pattern obtained upon developing, rounding of the shape at the top of the pattern, and the opposite problem of footing. Furthermore, the shape of the pattern is also poor, with problems including pattern collapse and thickness loss of the resist film.

The present invention takes the above circumstances into consideration, with objects of providing a positive resist composition for forming a thick-film resist that is capable of forming a thick-film resist pattern of favorable shape, as well as a thick-film resist laminate and a method of forming a resist pattern that use the above positive resist composition.

Means to Solve the Problems

In order to achieve the above objects, the present invention employs the aspects described below.

Namely, a first aspect of the present invention is a positive resist composition for forming a thick-film resist having a film thickness of 1 to 15 μm, the composition including:

a resin component (A) that contains acid dissociable, dissolution inhibiting groups and exhibits increased alkali solubility under the action of acid, an acid generator component (B) that generates acid upon exposure, and a nitrogen-containing organic compound (D), wherein the resin component (A) is a polymer compound (A1) with a weight average molecular weight of 20,000 to 50,000, having a structural unit (a1) derived from a hydroxystyrene and a structural unit (a2) derived from an acrylate ester containing an acid dissociable, dissolution inhibiting group, the acid generator component (B) includes an onium salt-based acid generator having an anion moiety represented by general formula (I): $R^{4"}SO_3^-$ [wherein, $R^{4"}$ represents a linear or branched alkyl group of 4 carbon atoms, or a linear or branched fluoroalkyl group of 4 carbon atoms], and the nitrogen-containing organic compound (D) includes a chain-like tertiary aliphatic amine.

A second aspect of the present invention is a thick-film resist laminate that includes a thick-film resist with a film thickness of 1 to 15 μm formed from a positive resist composition according to the first aspect laminated to the top of a support.

A third aspect of the present invention is a method of forming a resist pattern including: using a positive resist composition according to the first aspect to form a thick-film resist with a film thickness of 1 to 15 μm on a support, selectively exposing the thick-film resist; and subjecting the thick-film resist film to alkali developing to form a resist pattern.

In the present description and the claims, a "structural unit" refers to a monomer unit that contributes to the formation of a resin component (a polymer compound).

The term "hydroxystyrene" is a generic term that includes both the narrow definition of hydroxystyrene, as well as compounds in which the α-position hydrogen atom of the narrowly defined hydroxystyrene has been substituted with a substituent group such as a halogen atom, an alkyl group or a haloalkyl group or the like, and derivatives thereof. The expression "structural unit derived from a hydroxystyrene" describes a structural unit that is formed by the cleavage of the ethylenic double bond of the hydroxystyrene. Furthermore, unless stated otherwise, the "α-position (the carbon atom on the α-position)" of a structural unit derived from a hydroxystyrene refers to the carbon atom to which the benzene ring is bonded.

The term "structural unit derived from an acrylate ester" refers to a structural unit that is formed by the cleavage of the ethylenic double bond of an acrylate ester. The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a halogen atom such as a fluorine atom, an alkyl group or a haloalkyl group can be mentioned. With respect to the structural unit derived from an acrylate ester, the "α-position (the carbon atom on the α-position)" refers to the carbon atom having the carbonyl group bonded thereto, unless otherwise specified.

The term "(meth)acrylic acid" refers to either one of, or both, methacrylic acid and acrylic acid.

An "alkyl group" includes linear, branched or cyclic, monovalent saturated hydrocarbon groups, unless otherwise specified.

A "lower alkyl group" is an alkyl group of 1 to 5 carbon atoms.

The term "exposure" is used as a general concept that includes irradiation with any form of radiation, and includes irradiation with an electron beam.

Effect of the Invention

According to the present invention, there are provided a positive resist composition for forming a thick-film resist, which is capable of forming a thick-film resist pattern with a favorable shape, as well as a thick-film resist laminate and a method of forming a resist pattern that use this positive resist composition.

DESCRIPTION OF THE REFERENCE SYMBOLS

Figure 1A:
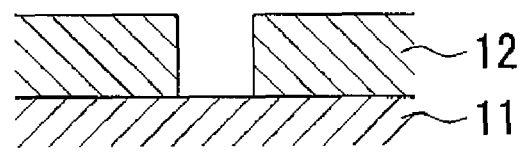
FIG. 1A A schematic illustration showing a process for forming a magnetic film pattern using a plating method in which a resist pattern is used as a frame, the figure describing a step of forming a plating seed layer on the upper surface of a substrate and then forming a slit-shaped resist pattern thereon using conventional lithography.

11: Plating seed layer
12: Resist pattern
13': Magnetic film
13: Magnetic film pattern

BEST MODE FOR CARRYING OUT THE INVENTION

<<Positive Resist Composition>>

A positive resist composition of the present invention is a composition used for forming a thick-film resist having a film thickness of 1 to 15 μm, the composition including a resin component (A) (hereafter, frequently referred to as "component A") which contains acid dissociable, dissolution inhibiting groups and exhibits increased alkali solubility under the action of acid, an acid generator component (B) (hereafter, frequently referred to as "component (B)") that generates acid upon irradiation, and a nitrogen-containing organic compound (D) (hereafter, frequently referred to as "component (D)").

In the positive resist composition of the present invention, when acid is generated from the component (B) upon exposure, the acid dissociable, dissolution inhibiting groups are dissociated and the alkali-solubility of the component (A) is enhanced. As a result, in the formation of a resist pattern, when a resist film that has been formed on top of a support using the positive resist composition is subjected to selective exposure, the exposed portions become more soluble in an alkali, and hence a resist pattern can be formed by developing with an alkali.

<Component (A)>

The component (A) must include a polymer compound (A1) with a weight average molecular weight of 20,000 to 50,000, having a structural unit (a1) derived from a hydroxystyrene and a structural unit (a2) derived from an acrylate ester that contains an acid dissociable, dissolution inhibiting group.

Polymer Compound (A1)

The structural unit (a1) is a structural unit derived from a hydroxystyrene. By including a polymer compound (A1) having the structural unit (a1) and the structural unit (a2) described below, and ensuring that the polymer compound has a specific weight average molecular weight, a resist pattern of favorable shape is able to be formed in the thick-film resist formed using the positive resist composition. Furthermore, including the structural unit (a1) improves the dry etching resistance.

Examples of the structural unit (a1) include structural units represented by general formula (a1-1) shown below.

[Chemical Formula 1]

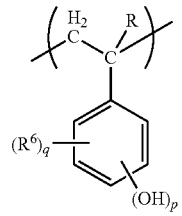

(a1-1)

[wherein, R represents a hydrogen atom, a lower alkyl group of 1 to 5 carbon atoms, a halogen atom or a halogenated lower alkyl group of 1 to 5 carbon atoms; $R^6$ represents a lower alkyl group of 1 to 5 carbon atoms; p represents an integer from 1 to 3; and q represents an integer from 0 to 2.]

In general formula (a1-1), R represents a hydrogen atom, a lower alkyl group, a halogen atom or a halogenated lower alkyl group.

A lower alkyl group represented by R is an alkyl group of 1 to 5 carbon atoms, is preferably a linear or branched alkyl group, and specific examples include a methyl group, ethyl group, propyl group, isopropyl group, n-butyl group, isobutyl group, tert-butyl group, pentyl group, isopentyl group or neopentyl group. A methyl group is preferred industrially.

Examples of the halogen atom include a fluorine atom, chlorine atom, bromine atom or iodine atom, and a fluorine atom is particularly preferred.

A halogenated lower alkyl group is a group in which some or all of the hydrogen atoms of an aforementioned lower alkyl group of 1 to 5 carbon atoms have been substituted with halogen atoms. In the present invention, all of the hydrogen atoms are preferably halogenated. The halogenated lower alkyl group is preferably a linear or branched halogenated lower alkyl group, is even more preferably a fluorinated lower alkyl group such as a trifluoromethyl group, pentafluoroethyl group, heptafluoropropyl group or nonafluorobutyl group, and is most preferably a trifluoromethyl group ($—CF_3$).

As R, a hydrogen atom or a methyl group is preferred, and a hydrogen atom is most preferred.

Examples of the lower alkyl group of 1 to 5 carbon atoms represented by $R^6$ include the same groups as the lower alkyl group represented by R.

q is an integer from 0 to 2. Of these, q is preferably either 0 or 1, and from an industrial perspective, is most preferably 0.

In those cases where q is 1, the substitution position of $R^6$ may be the o-position, the m-position or the p-position, whereas in those cases where q is 2, any combination of substitution positions can be used.

p is an integer of 1 to 3, and is preferably 1.

In those cases where p is 1, the substitution position of the hydroxyl group may be the o-position, the m-position, or the p-position, although from the viewpoints of ease of availability and cost, the p-position is preferred. Moreover, in those cases where p is either 2 or 3, any combination of substitution positions can be used.

As the structural unit (a1), one type may be used alone, or two or more types may be used in combination.

In the polymer compound (A1), the amount of the structural unit (a1) based on the combined total of all structural units constituting the polymer compound (A1) is preferably from 10 to 95 mol %, more preferably from 20 to 85 mol %, still more preferably from 30 to 80 mol %, and most preferably from 60 to 70 mol %. By making the amount of the structural unit (a1) fall within the above-mentioned range, a suitable level of alkali solubility can be obtained, and a good balance can be achieved with the other structural units.

The structural unit (a2) is a structural unit derived from an acrylate ester that contains an acid dissociable, dissolution inhibiting group.

Examples of the structural unit (a2) include structural units represented by general formula (a2-1) shown below.

[Chemical Formula 2]

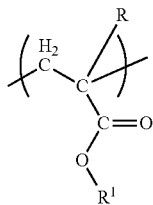
(a2-1)

[wherein, R is the same as R in the above formula (a1-1), and $R^1$ represents an acid dissociable, dissolution inhibiting group or an organic group that contains an acid dissociable, dissolution inhibiting group.]

Here, the term "acid dissociable, dissolution inhibiting group" describes a group which, as described above, dissociates under the action of the acid generated from the component (B) upon exposure, and is eliminated from the component (A) following exposure.

Furthermore, an "organic group that contains an acid dissociable, dissolution inhibiting group" describes a group composed of an acid dissociable, dissolution inhibiting group, and a group or atom that does not dissociate under the action of acid (namely, a group or atom that does not dissociate under the action of acid, but rather remains bonded to the component (A) even after dissociation of the acid dissociable, dissolution inhibiting group).

In the following description, the term "acid dissociable, dissolution inhibiting group" may be used as a generic term that includes both acid dissociable, dissolution inhibiting groups and organic groups that contain an acid dissociable, dissolution inhibiting group.

There are no particular restrictions on the acid dissociable, dissolution inhibiting group, and for example, any of the multitude of groups that have been proposed for the resins used within resist compositions designed for use with KrF excimer lasers and ArF excimer lasers can be used. Specific examples include the acid dissociable, dissolution inhibiting groups (I) and (II) shown below, and acid dissociable, dissolution inhibiting group-containing groups (IV) typified by chain-like tertiary alkoxycarbonyl groups or chain-like tertiary alkoxycarbonylalkyl groups.

There are no particular restrictions on the organic group that contains an acid dissociable, dissolution inhibiting group, and for example, any of the multitude of groups that have been proposed for the resins used within resist compositions designed for use with KrF excimer lasers and ArF excimer lasers can be used. Specific examples include organic groups containing the acid dissociable, dissolution inhibiting groups described above. For example, as an organic group that contains an acid dissociable, dissolution inhibiting group (II), the organic group (III) containing an acid dissociable, dissolution inhibiting group described below can be mentioned.

Acid Dissociable, Dissolution Inhibiting Group (I)

The acid dissociable, dissolution inhibiting group (I) is a chain-like or cyclic tertiary alkyl group.

The number of carbon atoms within the chain-like tertiary alkyl group is preferably within a range from 4 to 10, and is even more preferably from 4 to 8. Specific examples of the chain-like tertiary alkyl group include a tert-butyl group and a tert-amyl group.

The cyclic tertiary alkyl group is a monocyclic or polycyclic monovalent saturated hydrocarbon group that includes a tertiary carbon atom within the ring skeleton. The number of carbon atoms within the cyclic tertiary alkyl group is preferably within a range from 4 to 12, and is more preferably from 5 to 10. Specific examples include a 1-methylcyclopentyl group, 1-ethylcyclopentyl group, 1-methylcyclohexyl group, 1-ethylcyclohexyl group, 2-methyl-2-adamantyl group and 2-ethyl-2-adamantyl group.

In terms of achieving a superior effect for the present invention, namely, the effect that enables the formation of a thick-film resist pattern of favorable shape, the acid dissociable, dissolution inhibiting group (I) is preferably a chain-like tertiary alkyl group, and is most preferably a tert-butyl group.

Acid Dissociable, Dissolution Inhibiting Group (II)

The acid dissociable, dissolution inhibiting group (II) is a group represented by general formula (II) shown below.

[Chemical Formula 3]

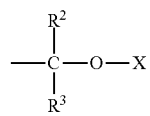
(II)

[wherein, X represents an aliphatic cyclic group, an aromatic cyclic hydrocarbon group, or a lower alkyl group of 1 to 5 carbon atoms, and $R^2$ represents a hydrogen atom or a lower alkyl group of 1 to 5 carbon atoms, or alternatively, X and $R^2$ each independently represent an alkylene group of 1 to 5 carbon atoms, wherein the terminals of X and $R^2$ are bonded together, and $R^3$ represents a lower alkyl group of 1 to 5 carbon atoms or a hydrogen atom.]

In formula (II), X represents an aliphatic cyclic group, an aromatic cyclic hydrocarbon group, or a lower alkyl group of 1 to 5 carbon atoms.

In the present description and the claims, the term "aliphatic" is a relative concept used in relation to the term "aromatic", and defines a group or compound or the like that has no aromaticity. Further, the term "aliphatic cyclic group" refers to a monocyclic group or polycyclic group that has no aromaticity, which may be either saturated or unsaturated, but is typically saturated.

The aliphatic cyclic group of X is a monovalent aliphatic cyclic group. The aliphatic cyclic group may use, for example, any of the multitude of groups that have been proposed for conventional ArF resists. Specific examples of the aliphatic cyclic group include aliphatic monocyclic groups of 5 to 7 carbon atoms and aliphatic polycyclic groups of 10 to 16 carbon atoms. Examples of the aliphatic monocyclic groups of 5 to 7 carbon atoms include groups in which one hydrogen atom has been removed from a monocycloalkane, and specific examples include groups in which one hydrogen atom has been removed from cyclopentane or cyclohexane or the like. Examples of the aliphatic polycyclic groups of 10 to 16 carbon atoms include groups in which one hydrogen atom has been removed from a bicycloalkane, tricycloalkane or tetracycloalkane or the like. Specific examples include groups in which one hydrogen atom has been removed from a polycycloalkane such as adamantane, norbornane, isobornane, tricyclodecane or tetracyclododecane. Of these groups, an adamantyl group, norbornyl group, or tetracyclododecanyl group is preferred industrially, and an adamantyl group is particularly desirable.

Examples of aromatic cyclic hydrocarbon groups represented by X include aromatic polycyclic groups of 10 to 16 carbon atoms. Specific examples include groups in which one hydrogen atom has been removed from naphthalene, anthracene, phenanthrene or pyrene or the like. Specific examples include a 1-naphthyl group, 2-naphthyl group, 1-anthracenyl group, 2-anthracenyl group, 1-phenanthryl group, 2-phenanthryl group, 3-phenanthryl group or 1-pyrenyl group, and of these, a 2-naphthyl group is particularly preferred industrially.

Examples of lower alkyl groups represented by X include the same lower alkyl groups as those described for R in the above formula (a1-1), and of these, a methyl group or ethyl group is preferred, and an ethyl group is the most desirable.

Examples of the lower alkyl group represented by $R^2$ in formula (II) include the same lower alkyl groups as those described for R in the above formula (a1-1). A methyl group or ethyl group is preferred industrially, and a methyl group is particularly desirable.

$R^3$ represents either a lower alkyl group or a hydrogen atom. Examples of the lower alkyl group represented by $R^3$ include the same lower alkyl groups as those described for $R^2$. From an industrial perspective, $R^3$ is preferably a hydrogen atom.

Further, in formula (II), X and $R^2$ may each independently represent an alkylene group of 1 to 5 carbon atoms, and the terminal of X may be bonded to the terminal of $R^2$.

In such a case, in formula (II), a cyclic group is formed by $R^2$, X, the oxygen atom having X bonded thereto, and the carbon atom having the oxygen atom and $R^2$ bonded thereto. Such a cyclic group is preferably a 4- to 7-membered ring, and more preferably a 4- to 6-membered ring. Specific examples of the cyclic group include a tetrahydropyranyl group and tetrahydrofuranyl group.

In terms of achieving a superior effect for the present invention, namely, the effect that enables the formation of a thick-film resist pattern of favorable shape, the acid dissociable, dissolution inhibiting group (II) is preferably a group in which $R^3$ is a hydrogen atom and $R^2$ is a hydrogen atom or a lower alkyl group.

Specific examples include groups in which X is a lower alkyl group, namely 1-alkoxyalkyl groups such as a 1-methoxyethyl group, 1-ethoxyethyl group, 1-isopropoxyethyl group, 1-n-butoxyethyl group, 1-tert-butoxyethyl group, methoxymethyl group, ethoxymethyl group, iso-propoxymethyl group, n-butoxymethyl group and tert-butoxymethyl group.

Further, examples of groups in which X is an aliphatic cyclic group include a 1 cyclohexyloxyethyl group, 1-(2-adamantyl)oxymethyl group, and a 1-(1-adamantyl)oxyethyl group represented by formula (II-a) shown below.

Examples of groups in which X is an aromatic cyclic hydrocarbon group include a 1-(2-naphthyl)oxyethyl group represented by formula (II-b) shown below.

Of the above groups, a 1-ethoxyethyl group is particularly preferred.

[Chemical Formula 4]

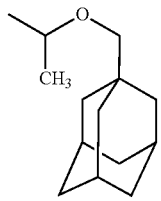
(I1-a)

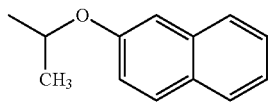
(I1-b)

Organic Group (III) Containing an Acid Dissociable, Dissolution Inhibiting Group The organic group (III) containing an acid dissociable, dissolution inhibiting group is a group represented by general formula (III) shown below. In an organic group (III) with this type of structure, when acid is generated from the component (B) upon exposure, the acid causes a cleavage of the bond between the oxygen atom bonded to Y and the carbon atom that is bonded to $R^4$ and $R^5$, resulting in the dissociation of a —C($R^4$)($R^5$)—OX' group.

[Chemical Formula 5]

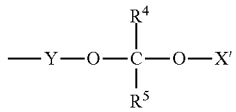
(III)

[wherein, X' represents an aliphatic cyclic group, an aromatic cyclic hydrocarbon group, or a lower alkyl group of 1 to 5 carbon atoms, and $R^4$ represents a hydrogen atom or a lower alkyl group of 1 to 5 carbon atoms, or alternatively, X' and $R^4$ each independently represent an alkylene group of 1 to 5 carbon atoms, wherein the terminals of X' and $R^4$ are bonded together, $R^5$ represents a lower alkyl group of 1 to 5 carbon atoms or a hydrogen atom, and Y represents an aliphatic cyclic group.]

In formula (III), examples of the aliphatic cyclic group, aromatic cyclic hydrocarbon group or lower alkyl group of 1 to 5 carbon atoms represented by X' include the same aliphatic cyclic groups, aromatic cyclic hydrocarbon groups and lower alkyl groups of 1 to 5 carbon atoms described for the group X in the above formula (II).

The lower alkyl group of 1 to 5 carbon atoms represented by $R^4$ is the same as the lower alkyl group of 1 to 5 carbon atoms represented by $R^2$.

The lower alkyl group of 1 to 5 carbon atoms represented by $R^5$ is the same as the lower alkyl group of 1 to 5 carbon atoms represented by $R^3$.

Examples of the aliphatic cyclic group of Y include groups in which a further one hydrogen atom has been removed from the aliphatic cyclic group of X.

Acid Dissociable, Dissolution Inhibiting Group-Containing Group (IV)

The acid dissociable, dissolution inhibiting group-containing group (IV) is an acid dissociable, dissolution inhibiting group-containing group that cannot be classified as one of the above acid dissociable, dissolution inhibiting groups (I) and (II) or as an organic group (III) containing an acid dissociable, dissolution inhibiting group (hereafter, this combination of groups is also referred to as "the acid dissociable, dissolution inhibiting groups (I) to (III)").

As the acid dissociable, dissolution inhibiting group-containing group (IV), any of the conventional acid dissociable, dissolution inhibiting group-containing groups that cannot be classified as one of the acid dissociable, dissolution inhibiting group groups (I) to (III) may be used.

Specific examples of acid dissociable, dissolution inhibiting group-containing groups that cannot be classified as one of the acid dissociable, dissolution inhibiting group groups (I) to (III) include chain-like tertiary alkoxycarbonyl groups and chain-like tertiary alkoxycarbonylalkyl groups.

The number of carbon atoms within the chain-like tertiary alkoxycarbonyl group is preferably within a range from 4 to 10, and more preferably from 4 to 8. Specific examples of chain-like tertiary alkoxycarbonyl groups include a tert-butoxycarbonyl group and a tert-amyloxycarbonyl group.

The number of carbon atoms within the chain-like tertiary alkoxycarbonylalkyl group is preferably within a range from 4 to 10, and more preferably from 4 to 8. Specific examples of chain-like tertiary alkoxycarbonylalkyl groups include a tert-butoxycarbonylmethyl group and a tert-amyloxycarbonylmethyl group.

In terms of achieving a superior effect for the present invention, namely, the effect that enables the formation of a thick-film resist pattern of favorable shape, the acid dissociable, dissolution inhibiting group-containing group within the structural unit (a2) preferably includes at least one type selected from the group consisting of the acid dissociable, dissolution inhibiting groups (I) to (III), and more preferably includes an acid dissociable, dissolution inhibiting group (I).

As the structural unit (a2), one type may be used alone, or two or more types may be used in combination.

In the polymer compound (A1), the amount of the structural unit (a2) based on the combined total of all structural units constituting the polymer compound (A1) is preferably from 1 to 80 mol %, more preferably from 1 to 60 mol %, still more preferably from 1 to 50 mol %, still more preferably from 1 to 40 mol %, and most preferably from 2 to 35 mol %. By making the amount of the structural unit (a2) at least as large as the lower limit of the above-mentioned range, a pattern can be formed using a resist composition prepared from the polymer compound (A1), whereas by making the amount of the structural unit (a2) no more than the upper limit of the above-mentioned range, a good balance can be achieved with the other structural units.

[Other Structural Units]

In addition to the above structural units (a1) and (a2), the polymer compound (A1) may further contain a structural unit which is other than the structural units (a1) and (a2). Specific examples of these other structural units include the structural units (a3) to (a5) described below.

Structural Unit (a3)

The structural unit (a3) is a structural unit derived from styrene. In the present invention, the polymer compound (A1) preferably includes the structural unit (a3). By including the structural unit (a3), and adjusting the amount thereof, the solubility of the polymer compound (A1) in alkali developing liquids can be regulated, and as a result, the alkali solubility of the thick-film resist can be controlled, enabling a further improvement in the pattern shape.

Here "styrene" is a generic term that includes both the narrow definition of styrene, as well as compounds in which the α-position hydrogen atom of the narrowly defined styrene has been substituted with a substituent group such as a halogen atom, an alkyl group or a haloalkyl group or the like, and derivatives thereof. A "structural unit derived from styrene" describes a structural unit that is formed by the cleavage of the ethylenic double bond of the styrene. In the styrene structure, one or more of the hydrogen atoms on the phenyl group may be substituted with a substituent group such as a lower alkyl group of 1 to 5 carbon atoms.

Examples of the structural unit (a3) include structural units represented by general formula (a3-1) shown below.

[Chemical Formula 6]

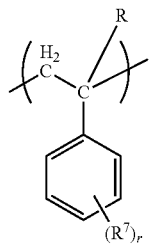

(a3-1)

[wherein, R is the same as R in the above formula (a1-1), $R^7$ represents a lower alkyl group of 1 to 5 carbon atoms, and r represents an integer from 0 to 3.]

In formula (a3-1), examples of the group R include the same groups as those described for R in the above formula (a1-1).

Examples of the lower alkyl group of 1 to 5 carbon atoms represented by $R^7$ include the same groups as the lower alkyl group of 1 to 5 carbon atoms represented by $R^6$ in the above formula (a1-1).

r is an integer from 0 to 3. Of these possibilities, r is preferably either 0 or 1, and from an industrial perspective, is most preferably 0.

In those cases where r is from 1 to 3, the substitution position of the $R^7$ group(s) may be the o-position, the m-position or the p-position, and in those cases where r is 2 or 3, any combination of substitution positions can be used.

As the structural unit (a3), one type may be used alone, or two or more types may be used in combination.

In those cases where the polymer compound (A1) includes a structural unit (a3), the amount of the structural unit (a3) based on the combined total of all structural units constituting the polymer compound (A1) is preferably from 1 to 20 mol %, more preferably from 3 to 15 mol %, and most preferably from 5 to 15 mol %. By making the amount of the structural unit (a3) fall within this range, the effect achieved by including the structural unit (a3) is significant, and a good balance can be achieved with the other structural units.

Structural Unit (a4)

The structural unit (a4) is a structural unit obtained by substituting the hydrogen atom of the hydroxyl group within the structural unit (a1) with an acid dissociable, dissolution inhibiting group-containing group. Including the structural unit (a4) improves the etching resistance and the resolution.

Examples of the acid dissociable, dissolution inhibiting group-containing group in the structural unit (a4) include the same groups as those described for the structural unit (a2). Of these, including at least one group selected from the group consisting of the acid dissociable, dissolution inhibiting groups (I) to (III) is preferred in terms of achieving a superior effect for the present invention, namely, the effect that enables the formation of a thick-film resist pattern of favorable shape.

Including either of the acid dissociable, dissolution inhibiting groups (I) or (II) is particularly desirable.

As the structural unit (a4), one type may be used alone, or two or more types may be used in combination.

In those cases where the polymer compound (A1) includes a structural unit (a4), the amount of the structural unit (a4) based on the combined total of all structural units constituting the polymer compound (A1) is preferably from 5 to 50 mol %, more preferably from 5 to 45 mol %, still more preferably from 10 to 40 mol %, and most preferably from 15 to 40 mol %. By making the amount of the structural unit (a4) at least as large as the lower limit of the above-mentioned range, the effect of the present invention achieved by including the structural unit (a4), namely, the effect that enables the formation of a thick-film resist pattern of favorable shape, is more significant, whereas by making the amount of the structural unit (a4) no more than the upper limit of the above-mentioned range, a good balance can be achieved with the other structural units.

Structural Unit (a5)

The structural unit (a5) is a structural unit derived from an acrylate ester having an alcoholic hydroxyl group. Including the structural unit (a5) further improves the effect of the present invention, namely, the effect that enables the formation of a thick-film resist pattern of favorable shape.

Examples of the structural unit (a5) include structural units having chain-like or cyclic alkyl groups that include an alcoholic hydroxyl group. In other words, the structural unit (a5) is preferably a structural unit derived from an acrylate ester having an alcoholic hydroxyl group-containing chain-like or cyclic alkyl group.

If the structural unit (a5) includes a structural unit derived from an acrylate ester having an alcoholic hydroxyl group-containing cyclic alkyl group (hereafter, also referred to as simply a "structural unit having a hydroxyl group-containing cyclic alkyl group"), then the resolution is enhanced, and the etching resistance also improves.

If the structural unit (a5) includes a structural unit derived from an acrylate ester having an alcoholic hydroxyl group-containing chain-like alkyl group (hereafter, also referred to as simply a "structural unit having a hydroxyl group-containing chain-like alkyl group"), then the hydrophilicity of the entire component (A) is enhanced, thereby enhancing the affinity with the developing liquid and improving the resolution.

"Structural Unit Having a Hydroxyl Group-Containing Cyclic Alkyl Group"

Examples of the structural unit having a hydroxyl group-containing cyclic alkyl group include structural units in which a hydroxyl group-containing cyclic alkyl group is bonded to the ester group [—C(O)O—] of the acrylate ester Here, the term "hydroxyl group-containing cyclic alkyl group" describes a cyclic alkyl group with a hydroxyl group bonded thereto.

The number of bonded hydroxyl groups is preferably within a range from 1 to 3, and is most preferably 1.

The cyclic alkyl group may be either a monocyclic or polycyclic group, but is preferably a polycyclic group. Further, the number of carbon atoms within the cyclic alkyl group is preferably within a range from 5 to 15.

Specific examples of the cyclic alkyl group are described below.

Examples of monocyclic cyclic alkyl groups include groups in which 1 to 4 hydrogen atoms have been removed from a cycloalkane. More specific examples of such monocyclic cyclic alkyl groups include groups in which 1 to 4 hydrogen atoms have been removed from cyclopentane or cyclohexane, and of these, a cyclohexyl group is preferred.

Examples of polycyclic cyclic alkyl groups include groups in which 1 to 4 hydrogen atoms have been removed from a bicycloalkane, tricycloalkane, or tetracycloalkane or the like. More specific examples include groups in which 1 to 4 hydrogen atoms have been removed from a polycycloalkane such as adamantane, norbornane, isobornane, tricyclodecane, or tetracyclododecane.

These types of cyclic alkyl groups can be selected appropriately from the multitude of groups proposed for forming acid-dissociable, dissolution-inhibiting groups for use within resins for photoresist compositions used within ArF excimer laser processes. Of the various possibilities, cyclohexyl groups, adamantyl groups, norbornyl groups, and tetracyclododecanyl groups are readily available industrially, and are consequently preferred.

Of the various monocyclic groups and polycyclic groups exemplified above, a cyclohexyl group or adamantyl group is preferred, and an adamantyl group is particularly desirable.

Specific examples of structural units having a hydroxyl group-containing cyclic alkyl group include structural units (a5-1) represented by general formula (a5-1) shown below.

[Formula 7]

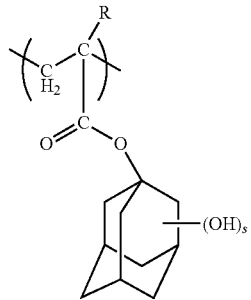

(a5-1)

[wherein, R is the same as R within the above formula (a1-1), and s represents an integer from 1 to 3.]

In formula (a5-1), examples of R include the same groups as those described for R in the above formula (a1-1).

s represents an integer from 1 to 3, and is most preferably 1.

Although there are no particular restrictions on the bonding position of the hydroxyl group, the hydroxyl group is preferably bonded to position 3 of the adamantyl group.

"Structural Unit Having a Hydroxyl Group-Containing Chain-Like Alkyl Group"

Examples of the structural unit having a hydroxyl group-containing chain-like alkyl group include structural units in which a chain-like hydroxyalkyl group is bonded to the ester group [—C(O)O—] of the acrylate ester. Here, the term "chain-like hydroxyalkyl group" describes a chain-like (linear or branched) alkyl group in which some or all of the hydrogen atoms have been substituted with hydroxyl groups.

As the structural unit having a hydroxyl group-containing chain-like alkyl group, a structural unit (a5-2) represented by general formula (a5-2) shown below is particularly preferred.

[Formula 8]

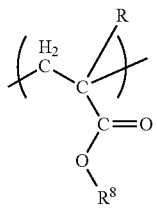

(a5-2)

[wherein, R is the same as R within the above formula (a1-1), and $R^8$ represents a chain-like hydroxyalkyl group.]

R in formula (a5-2) is the same as R in the above general formula (a1-1).

The chain-like hydroxyalkyl group represented by $R^8$ is preferably a lower hydroxyalkyl group of 1 to 10 carbon atoms, more preferably a lower hydroxyalkyl group of 2 to 8 carbon atoms, and is most preferably a linear lower hydroxyalkyl group of 2 to 4 carbon atoms.

There are no particular restrictions on the number of hydroxyl groups within the hydroxyalkyl group or the bonding positions of those groups, although one hydroxyl group is typical, and the hydroxyl group is preferably bonded to the terminal of the alkyl group.

As the structural unit (a5), one type may be used alone, or two or more types may be used in combination.

In those cases where the polymer compound (A1) includes a structural unit (a5), the amount of the structural unit (a5) based on the combined total of all structural units constituting the polymer compound (A1) is preferably from 5 to 50 mol %, more preferably from 5 to 45 mol %, still more preferably from 10 to 40 mol %, and most preferably from 15 to 40 mol %. By making the amount of the structural unit (a5) at least as large as the lower limit of the above-mentioned range, the effect achieved by including the structural unit (a5), namely, the effect that enables the formation of a thick-film resist pattern of favorable shape, is more significant, whereas by making the amount of the structural unit (a5) no more than the upper limit of the above-mentioned range, a good balance can be achieved with the other structural units.

The polymer compound (A1) may further contain a structural unit (a6) which is other than the above-mentioned structural units (a1) to (a5), as long as the effects of the present invention are not impaired.

There are no particular restrictions on the structural unit (a6), provided it is not able to be classified as one of the above-mentioned structural units (a1) to (a5), and any of the multitude of conventional structural units that have been used within the resins used within resists designed for use with KrF excimer lasers and ArF excimer lasers (and preferably for use with ArF excimer lasers) can be used.

In the present invention, the polymer compound (A1) is preferably a copolymer that includes at least the structural unit (a1) and the structural unit (a2).

This copolymer may either be a copolymer formed solely from the structural units (a1) and (a2), or may be a copolymer that includes the structural units (a1) and (a2), and further includes at least one of the other structural units (a3), (a4) and (a5). In terms of achieving a superior effect for the present invention, namely, the effect that enables the formation of a thick-film resist pattern of favorable shape, binary copolymers (A1-2) composed of the structural units (a1) and (a2); ternary copolymers (A1-3) composed of the structural units (a1), (a2) and (a3); quaternary copolymers (A1-4-1) composed of the structural units (a1), (a2), (a3) and (a4); and quaternary copolymers (A1-4-2) composed of the structural units (a1), (a2), (a3) and (a5) are preferred, and the ternary copolymers (A3-1) are particularly desirable.

In the ternary copolymer (A1-3), the proportion of the structural unit (a1) based on the combined total of all structural units constituting the ternary copolymer (A1-3) is preferably from 10 to 95 mol %, more preferably from 20 to 85 mol %, still more preferably from 30 to 80 mol %, and most preferably from 60 to 70 mol %. The proportion of the structural unit (a2) is preferably from 1 to 80 mol %, more preferably from 1 to 60 mol %, still more preferably from 1 to 50 mol %, and most preferably from 2 to 35 mol %. The proportion of the structural unit (a3) is preferably from 1 to 20 mol %, more preferably from 3 to 15 mol %, and most preferably from 5 to 15 mol %.

As the polymer compound (A1), copolymers that include the three structural units shown in general formula (A-11) shown below are particularly preferred.

[Chemical Formula 9]

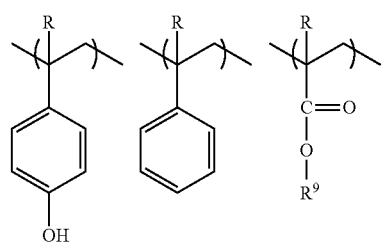

(A-11)

[wherein, R is the same as R within the above formula (a1-1), and $R^9$ represents a tertiary alkyl group of 4 to 12 carbon atoms.]

The polymer compound (A1) can be obtained, for example, by a conventional radical polymerization or the like of the monomers corresponding with each of the structural units, using a radical polymerization initiator such as azobisisobutyronitrile (AIBN). In one example, the polymer compound (A1) is produced by preparing a monomer in which the hydroxyl group of a hydroxystyrene has been protected with a protective group such as an acetyl group, and a monomer that corresponds with the structural unit (a2), copolymerizing these monomers using a normal method, and then conducting a hydrolysis to replace the protective group with a hydrogen atom, thereby generating the structural unit (a1).

The weight average molecular weight (Mw) (the polystyrene equivalent value determined by gel permeation chromatography (GPC)) of the polymer compound (A1) is typically within a range from 20,000 to 50,000.

Making the weight average molecular weight at least 20,000 enables the effect of the present invention, namely the effect that enables the formation of a thick-film resist pattern of favorable shape, to be obtained, and for example, yields effects such as an improvement in the rectangular formability of the resist pattern and a reduction in the thickness loss. Further, other effects are also obtained, including an improvement in the heat resistance and an improvement in the etching resistance of the thick-film resist obtained using the positive resist composition.

By making the weight average molecular weight no more than 50,000, the polymer compound (A1) exhibits satisfactory solubility in a resist solvent. As a result, the occurrence of defects can also be suppressed. Defects refers to general abnormalities of a resist pattern, which are detected when observed from right above the developed resist pattern, using a surface defect detection equipment (trade name: "KLA") manufactured by KLA-TENCOR CORPORATION. Examples of these abnormalities include post-developing scum, foam, dust, bridges across different portions of the resist pattern, color irregularities, and foreign deposits. Inhibiting the occurrence of defects is very important in those cases where a high-resolution resist pattern is required.

The Mw value is preferably within a range from 20,000 to 40,000, and more preferably from 20,000 to 30,000.

Further, smaller values for the degree of dispersion (Mw/Mn (the number average molecular weight)) of the polymer compound (A1) (namely, polymer compounds closer to being monodisperse) are preferred, as they yield superior resolution. The degree of dispersion is preferably within a range from 1.0 to 5.0, more preferably from 1.0 to 3.0, and most preferably from 1.0 to 2.5.

As the polymer compound (A1), one type may be used alone, or two or more types may be used in combination.

In order to achieve a favorable effect for the present invention, the amount of the polymer compound (A1) within the component (A) is preferably within a range from 50 to 100% by weight, more preferably from 80 to 100% by weight, and is most preferably 100% by weight.

In the present invention, the component (A) may further include, in addition to the polymer compound (A1), any of the resins typically used as a resin for a chemically amplified positive resist, such as a PHS-based resin or an acrylic resin, as long as the effects of the present invention are not impaired.

In the positive resist composition of the present invention, the amount of the component (A) can be appropriately adjusted depending on the thickness of the resist film to be formed.

<Component (B)>

The component (B) includes an onium salt-based acid generator having an anion moiety represented by general formula (I): $R^{4''}SO_3^-$ [wherein, $R^{4''}$ represents a linear or branched alkyl group or a linear or branched fluoroalkyl group of 4 carbon atoms] (hereafter also referred to as the component (B1)). Including this component (B1) improves the resist pattern shape. The reasons for this effect are not entirely clear, although it is thought that compared with onium salts in which the number of carbon atoms within $R^{4''}$ is 3 or less, for example the case where $R^{4''}$ contains only one carbon atom, the acid generated from the component (B) is less readily dispersed within the resist film. Furthermore compared with salts in which the number of carbon atoms within $R^{4''}$ is 5 or greater, the component (B1) has a smaller environmental impact and offers excellent safety.

The alkyl group represented by $R^{4''}$ may be either linear or branched, but a linear alkyl group (namely, an n-butyl group) is particularly preferred.

A fluoroalkyl group represented by $R^{4''}$ is a group in which some or all of the hydrogen atoms of the above alkyl group have been substituted with fluorine atoms. The fluorination ratio of the fluoroalkyl group (the ratio of the number of fluorine atoms within the fluoroalkyl group relative to the total number of hydrogen atoms within the original alkyl group in which none of the hydrogen atoms have been substituted with fluorine atoms) is preferably within a range from 10 to 100%, and more preferably from 50 to 100%, and perfluoroalkyl groups (namely, nonafluorobutyl groups) in which all of the hydrogen atoms have been substituted with fluorine atoms yield the strongest acids, and are consequently the most desirable.

The group $R^{4''}$ is preferably a linear alkyl group or fluoroalkyl group, more preferably a linear fluoroalkyl group, and is most preferably a nonafluoro-n-butyl group.

There are no particular restrictions on the component (B1) as long as it includes an anion moiety represented by the above general formula (I), and any of the onium salt-based acid generators proposed for use in conventional chemically amplified resists can be used.

Examples of preferred forms of the component (B1) include the acid generators (b-0) represented by general formula (b-0) shown below.

[Chemical Formula 10]

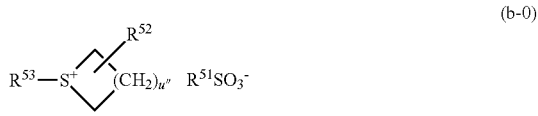

(b-0)

[wherein, $R^{51}$ represents the same linear or branched alkyl group or fluoroalkyl group of 4 carbon atoms as the above group $R^{4''}$; $R^{52}$ represents a hydrogen atom, a hydroxyl group, a halogen atom, a linear or branched alkyl group, a linear or branched haloalkyl group, or a linear or branched alkoxy group; $R^{53}$ represents an aryl group that may include a substituent group; and u'' represents an integer from 1 to 3.]

$R^{52}$ represents a hydrogen atom, a hydroxyl group, a halogen atom, a linear or branched alkyl group, a linear or branched haloalkyl group, or a linear or branched alkoxy group.

Examples of the halogen atom represented by $R^{52}$ include a fluorine atom, bromine atom, chlorine atom or iodine atom, and a fluorine atom is preferred.

The alkyl group represented by $R^{52}$ may be either a linear or branched group, and the number of carbon atoms within the group is preferably within a range from 1 to 5, more preferably from 1 to 4, and most preferably from 1 to 3.

Examples of linear or branched haloalkyl groups represented by $R^{52}$ include groups in which some or all of the hydrogen atoms within a linear or branched alkyl group have been substituted with halogen atoms. Here, the alkyl group is the same as the "alkyl group" described above for $R^{52}$. The substituent halogen atoms are the same as those described above in relation to "halogen atoms". In the haloalkyl group, 50 to 100% of the total number of hydrogen atoms are preferably substituted with halogen atoms, and groups in which all of the hydrogen atoms have been substituted are particularly desirable.

Examples of the alkoxy group represented by $R^{52}$ include linear and branched groups in which the number of carbon atoms is preferably within a range from 1 to 5, more preferably from 1 to 4, and most preferably from 1 to 3.

Of the groups described above, $R^{52}$ is most preferably a hydrogen atom.

$R^{53}$ represents an aryl group that may include a substituent group, and examples of the basic ring structure excluding any substituent groups (the matrix ring structure) include a naphthyl group, phenyl group or anthracenyl group, and from the viewpoints of maximizing the effects of the present invention and ensuring favorable absorption of the exposure light such as the ArF excimer laser light, a phenyl group is preferred.

Examples of the substituent group include a hydroxyl group or a lower alkyl group (which may linear or branched, preferably contains from 1 to 5 carbon atoms, and is most preferably methyl group).

The aryl group represented by $R^{53}$ preferably contains no substituent groups.

u" represents an integer from 1 to 3, is preferably either 2 or 3, and is most preferably 3.

Examples of preferred acid generators (b-0) include the compounds shown below.

[Chemical Formula 11]

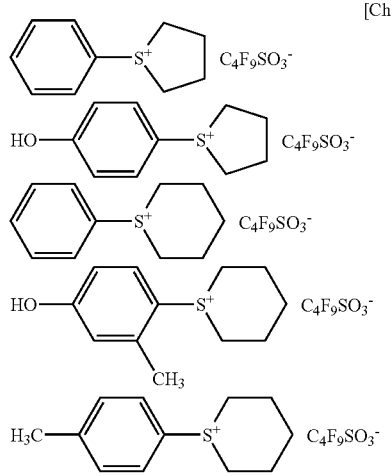

Furthermore, examples of preferred acid generators of the component (B1) other than the above acid generators (b-0) include acid generators (b-1) represented by general formula (b-1) shown below, and acid generators (b-2) represented by general formula (b-2) shown below.

[Chemical Formula 12]

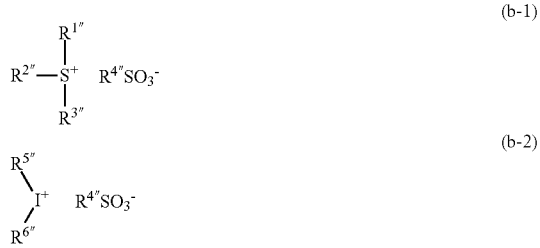

[wherein $R^{1\prime\prime}$ to $R^{3\prime\prime}$, $R^{5\prime\prime}$ and $R^{6\prime\prime}$ each independently represents an aryl group or a linear, branched or cyclic alkyl group; and $R^{4\prime\prime}$ represents the same linear or branched alkyl group or fluoroalkyl group of 4 carbon atoms as that described above; with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. Among $R^{1\prime\prime}$ to $R^{3\prime\prime}$, at least one group represents an aryl group.

Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not specifically limited. For example, an aryl group having 6 to 20 carbon atoms may be used in which some or all of the hydrogen atoms of an abovementioned aryl group may or may not be substituted with alkyl groups, alkoxy groups or halogen atoms. The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not specifically limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1\prime\prime}$ to $R^{3\prime\prime}$ is either a phenyl group or a naphthyl group.

In formula (b-2), $R^{5\prime\prime}$ and $R^{6\prime\prime}$ each independently represents an aryl group or alkyl group. At least one of $R^{5\prime\prime}$ and $R^{6\prime\prime}$ represents an aryl group. It is most preferable that both of $R^{5\prime\prime}$ and $R^{6\prime\prime}$ represents an aryl group.

As the aryl group for $R^{5\prime\prime}$ and $R^{6\prime\prime}$, the same as the aryl groups for $R^{1\prime\prime}$ to $R^{3\prime\prime}$ can be exemplified.

As the alkyl group for $R^{5\prime\prime}$ and $R^{6\prime\prime}$, the same as the alkyl groups for $R^{1\prime\prime}$ to $R^3$ can be exemplified.

It is most desirable that both of $R^{5\prime\prime}$ and $R^{6\prime\prime}$ represents a phenyl group.

Specific examples of the acid generator (b-1) include triphenylsulfonium nonafluorobutanesulfonate, tri(4-methylphenyl)sulfonium nonafluorobutanesulfonate, dimethyl(4-hydroxynaphthyl)sulfonium nonafluorobutanesulfonate, monophenyldimethylsulfonium nonafluorobutanesulfonate, diphenylmonomethylsulfonium nonafluorobutanesulfonate, (4-methylphenyl)diphenylsulfonium nonafluorobutanesulfonate, (4-methoxyphenyl)diphenylsulfonium nonafluorobutanesulfonate, tri(4-tert-butyl)phenylsulfonium nonafluorobutanesulfonate, diphenyl(1-(4-methoxy)naphthyl)sulfonium nonafluorobutanesulfonate, and di(1-naphthyl)phenylsulfonium nonafluorobutanesulfonate. Furthermore, onium salts in which the anion moiety of the above onium salts has been substituted with n-butanesulfonate can also be used.

Specific examples of the acid generator (b-2) include diphenyliodonium nonafluorobutanesulfonate and bis(4-tert-butylphenyl)iodonium nonafluorobutanesulfonate. Furthermore, onium salts in which the anion moiety of these onium salts has been substituted with n-butanesulfonate can also be used.

As the component (B1), one of the above acid generators may be used alone, or two or more types of acid generators may be used in combination.

In terms of achieving the effect of the present invention, the amount of the component (B1) within the component (B) is preferably within a range from 10 to 100% by weight, more preferably from 50 to 100% by weight, and is most preferably 100% by weight.

In the present invention, the component (B) may further contain another acid generator (hereafter referred to as the component (B2)) which is other than the component (B1), as long as the effects of the present invention are not impaired.

There are no particular restrictions on the component (B2) provided it does not correspond with a compound of the component (B1), and any of the compounds that have been proposed as acid generators for conventional chemically amplified resists can be used. Examples of these types of acid generators are numerous, and include onium salt-based acid generators such as iodonium salts and sulfonium salts (but excluding the component (B1)), oxime sulfonate-based acid generators, diazomethane-based acid generators such as bis-alkyl or bisaryl sulfonyl diazomethanes and poly(bis-sulfonyl)diazomethanes, nitrobenzyl sulfonate-based acid generators, iminosulfonate-based acid generators, and disulfone-based acid generators.

Examples of onium salt-based acid generators that are not included within the component (B1) include onium salt-based acid generators having an anion moiety represented by the above general formula (I) in which $R^{4'''}$ is a linear, branched or cyclic alkyl group (but excluding linear or branched alkyl groups having 4 carbon atoms) or a linear, branched or cyclic fluoroalkyl group (but excluding linear or branched fluoroalkyl groups having 4 carbon atoms).

The linear or branched alkyl group, or linear or branched fluoroalkyl group preferably contains from 1 to 3, or from 5 to 10 carbon atoms, more preferably from 1 to 3, or from 5 to 8 carbon atoms, and most preferably from 1 to 3 carbon atoms.

The above-mentioned cyclic alkyl group or fluoroalkyl group preferably contains from 4 to 12 carbon atoms, more preferably from 5 to 10 carbon atoms, and most preferably from 6 to 10 carbon atoms.

The fluorination ratio of the fluoroalkyl group is preferably from 10 to 100%, more preferably from 50 to 100%, and groups in which all of the hydrogen atom have been substituted with fluorine atoms yield stronger acids, and are therefore the most desirable.

Preferred examples of these acid generators include compounds in which the group $R^{51}$ in the above general formula (b-0) or the group $R^{4'''}$ in the above general formulas (b-13) or (b-2) is an above-mentioned alkyl group or fluoroalkyl group (namely, an alkyl group or fluoroalkyl group described above for the onium salt-based acid generators which are other than the component (B1)), and specific examples include the compounds shown below.

[Chemical Formula 13]

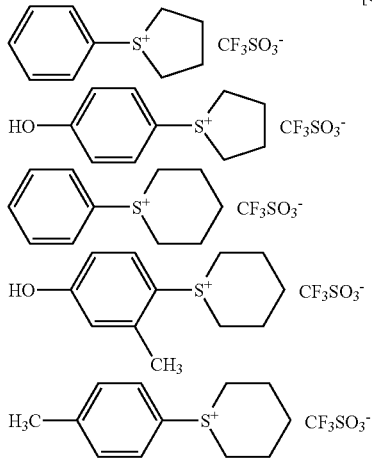

diphenyliodonium trifluoromethanesulfonate, bis(4-tert-butylphenyl)iodonium trifluoromethanesulfonate, triphenylsulfonium trifluoromethanesulfonate or heptafluoropropanesulfonate, tri(4-methylphenyl)sulfonium trifluoromethanesulfonate or heptafluoropropanesulfonate, dimethyl(4-hydroxynaphthyl)sulfonium trifluoromethanesulfonate or heptafluoropropanesulfonate, monophenyldimethylsulfonium trifluoromethanesulfonate or heptafluoropropanesulfonate, diphenylmonomethylsulfonium trifluoromethanesulfonate or heptafluoropropanesulfonate, (4-methylphenyl)diphenylsulfonium trifluoromethanesulfonate or heptafluoropropanesulfonate, (4-methoxyphenyl)diphenylsulfonium trifluoromethanesulfonate or heptafluoropropanesulfonate, tri(4-tert-butyl)phenylsulfonium trifluoromethanesulfonate or heptafluoropropanesulfonate, diphenyl(1-(4-methoxy)naphthyl)sulfonium trifluoromethanesulfonate or heptafluoropropanesulfonate, and di(1-naphthyl)phenylsulfonium trifluoromethanesulfonate or heptafluoropropanesulfonate. It is also possible to use onium salts in which the anion moiety of these onium salts are replaced by methanesulfonate, n-propanesulfonate or n-octanesulfonate.

Further, onium salt-based acid generators in which the anion moiety in general formula (b-1) or (b-2) is replaced with an anion moiety represented by general formula (b-3) or (b-4) shown below (the cation moiety is the same as (b-1) or (b-2)) may also be used.

[Chemical Formula 14]

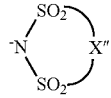 (b-3)

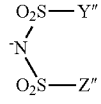 (b-4)

[wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.]

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or those of the alkyl group of Y" and Z" within the range of the number of carbon atoms, the more the solubility in a resist solvent becomes better.

Further, in the alkylene group of X" or the alkyl group of Y" and Z", it is preferable that the number of hydrogen atoms substituted with a fluorine atom is as large as possible, as the acid strength increases, and the transparency to high energy radiation of 200 nm or less or electron beam is improved. The fluorination ratio the alkylene group or alkyl group is preferably from 70 to 100%, more preferably from 90 to 100%, and it is particularly desirable that the alkylene group or alkyl group a perfluoroalkylene or perfluoroalkyl group in which all hydrogen atoms are substituted with fluorine atoms.

In the present description, an oxime sulfonate-based acid generator is a compound having at least one group represented by general formula (B-1) shown below, and has a feature of generating acid by irradiation. Such oxime sulfonate-based acid generators are widely used for a chemically amplified resist composition, and can be appropriately selected.

[Chemical Formula 15]

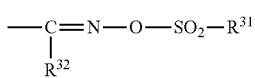
(B-1)

[wherein $R^{31}$ and $R^{32}$ each independently represents an organic group.]

The organic groups of $R^{31}$ and $R^{32}$ each refer to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are replaced with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable.

The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and the fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable.

The "partially halogenated aryl group" refers to an aryl group in which some of the hydrogen atoms are substituted with halogen atoms, and the "completely halogenated aryl group" refers to an aryl group in which all of hydrogen atoms are substituted by halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 16]

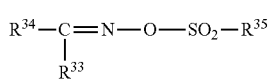
(B-2)

[wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.]

[Chemical Formula 17]

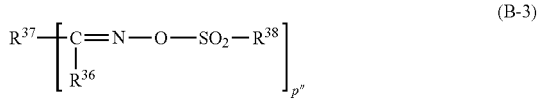
(B-3)

[wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.]

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As for the $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and still more preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthracyl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, and alkoxy group. The alkyl group and the halogenated alkyl group serving as the substituent preferably has 1 to 8 carbon atoms, and more preferably 1 to 4 carbon atoms. The halogenated alkyl group thereof is preferably a fluorinated alkyl group.

The alkyl group having no substituent or the halogenated alkyl group for $R^{35}$ preferably has 1 to 10 carbon atoms, more preferably 1 to 8 carbon atoms, most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, the oxime sulfonate-based acid generators disclosed in Japanese Unexamined Patent Application, First Publication No. Hei 09-208554 (chemical formula 18 to chemical formula 19 in paragraphs [0012] to [0014]), and the oxime sulfonate-based acid generators disclosed in WO2004/074242A2 (Examples 1 to 40 on pages 65 through 85) can also be used favorably.

Further examples of preferred compounds include those shown below.

[Chemical Formula 18]

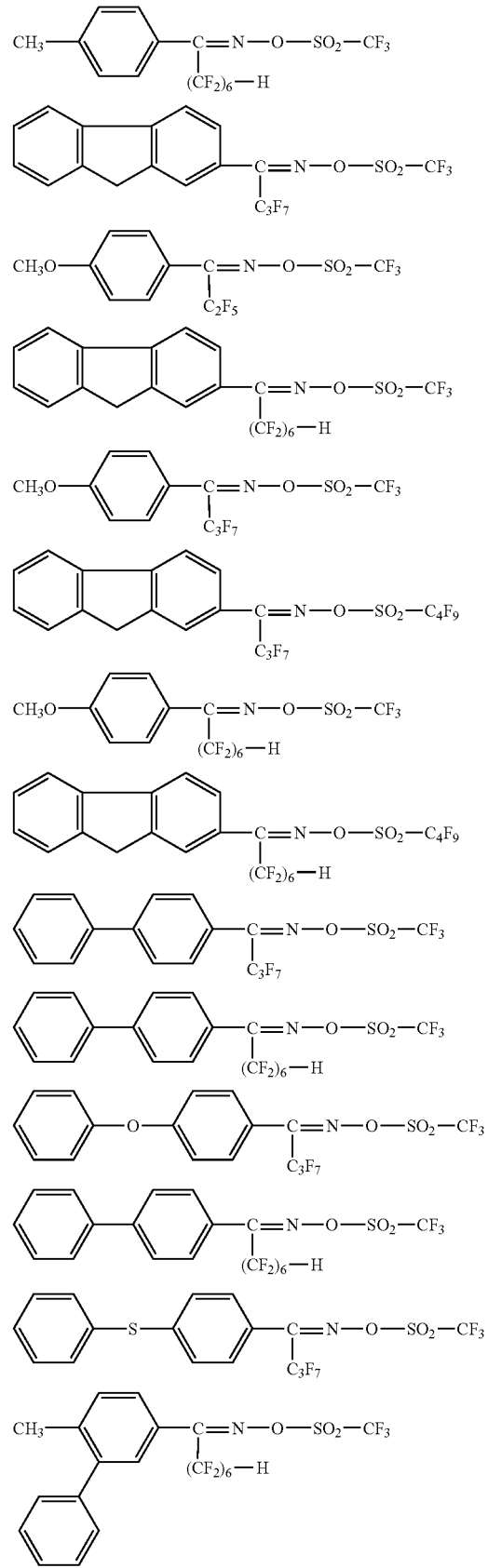

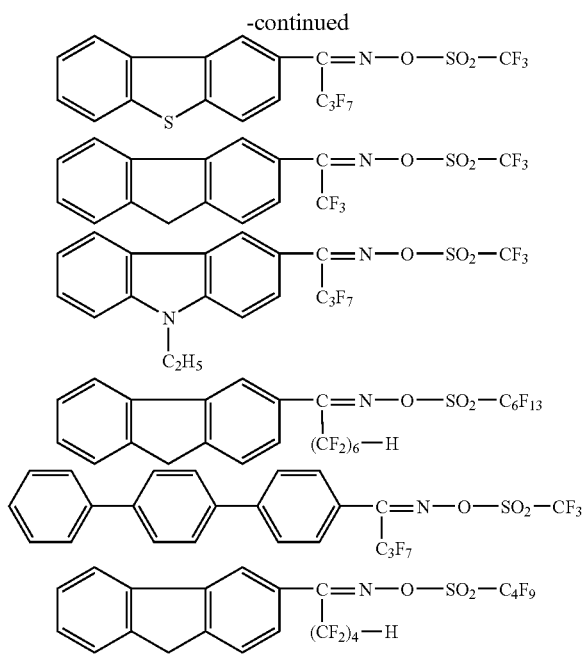

Of the compounds exemplified above, the four compounds shown below are particularly desirable.

[Chemical Formula 19]

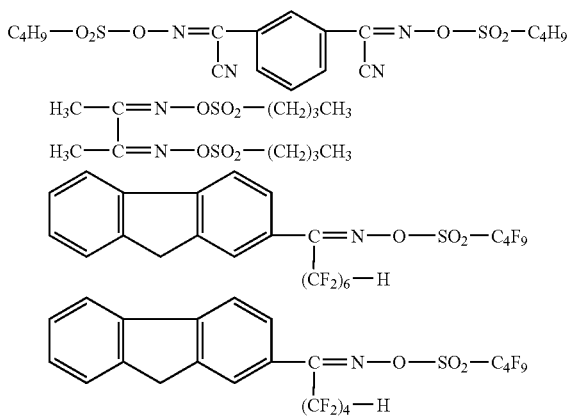

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, the diazomethane-based acid generators disclosed in Japanese Unexamined Patent Application, First Publication No. Hei 11-035551, Japanese Unexamined Patent Application, First Publication No. Hei 11-035552, and Japanese Unexamined Patent Application, First Publication No. Hei 11-035573 can also be used favorably.

Furthermore, specific examples of poly(bis-sulfonyl)diazomethanes include the structures disclosed in Japanese Unexamined Patent Application, First Publication No. Hei 11-322707, such as 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B2), one type of acid generator may be used alone, or two or more types of acid generators may be used in combination.

The amount of the component (B) within a positive resist composition of the present invention is preferably within a range from 0.1 to 10 parts by weight, more preferably from 0.1 to 5 parts by weight, and most preferably from 0.3 to 3 parts by weight, per 100 parts by weight of the component (A), because such an amount yields a superior effect for the present invention, namely, the effect that enables the formation of a thick-film resist pattern of favorable shape. When the amount of the component (B) is within the above-mentioned range, formation of a resist pattern can be satisfactorily performed. Further, by virtue of the above-mentioned range, a uniform solution can be obtained and the storage stability becomes satisfactory.

<Component (D)>

The positive resist composition of the present invention further includes the component (D), and the component (D) must include a chain-like tertiary aliphatic amine. Including this component (D) improves the resist pattern shape, and for example, enables the formation of a resist pattern that exhibits a high degree of verticalness of the side walls and excellent rectangular formability. The reasons why this effect is achieved are not entirely clear, although it is thought that the tertiary aliphatic amine disperses uniformly within the resist film, thereby effectively inhibiting the diffusion of the acid generated from the component (B). Further, including a component (D) such as a tertiary aliphatic amine also improves other properties such as the post exposure stability of the latent image formed by the pattern-wise exposure of the resist layer.

As the chain-like tertiary aliphatic amine, any of the multitude of conventional compounds that have been proposed may be used, and examples thereof include amines in which all three hydrogen atoms of ammonia ($NH_3$) has been substituted with an alkyl group or hydroxyalkyl group of not more than 12 carbon atoms (that is, trialkylamines or tri(alkyl alcohol) amines).

Specific examples of trialkylamines include trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine.

Specific examples of tri(alkyl alcohol) amines include tri-ethanolamine, triisopropanolamine, and tri-n-octanolamine.

As the chain-like tertiary aliphatic amine, one type may be used alone, or two or more types may be used in combination.

In terms of achieving a favorable effect for the present invention, the amount of the chain-like tertiary aliphatic amine within the component (D) is preferably within a range from 10 to 100% by weight, more preferably from 50 to 100% by weight, and is most preferably 100% by weight.

In the present invention, the component (D) may also include a nitrogen-containing organic compound that is other than a chain-like tertiary aliphatic amine, as long as the effects of the present invention are not impaired.

There are no particular restrictions on this nitrogen-containing organic compound that is other than a chain-like tertiary aliphatic amine, and conventional compounds may be used. Specific examples thereof include cyclic amines and aliphatic amines other than tertiary aliphatic amines.

In the present invention, the term "aliphatic amine" describes a chain-like amine having a structure in which at least one of the three hydrogen atoms of ammonia ($NH_3$) has been substituted with a monovalent aliphatic group, and in which the molecule contains no cyclic structures. The aliphatic group preferably contains from 1 to 12 carbon atoms.

A "cyclic amine" describes an amine having a cyclic structure within the molecule, and the cyclic structure may be either an aliphatic or aromatic cyclic structure.

Examples of cyclic amines include heterocyclic compounds containing a nitrogen atom as the hetero atom. These heterocyclic compounds may be either monocyclic compounds (aliphatic monocyclic amines) or polycyclic compounds (aliphatic polycyclic amines).

Specific examples of aliphatic monocyclic amines include piperidine and piperazine.

As the aliphatic polycyclic amine, compounds of 6 to 10 carbon atoms are preferred, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aliphatic amines that are other than tertiary aliphatic amines include amines in which one hydrogen atom of ammonia ($NH_3$) has been substituted with an alkyl group or hydroxyalkyl group of not more than 12 carbon atoms (that is, monoalkylamines or mono(alkyl alcohol amines)); and amines in which two hydrogen atoms of ammonia ($NH_3$) have been substituted with alkyl groups or hydroxyalkyl groups of not more than 12 carbon atoms (that is, dialkylamines or di(alkyl alcohol amines)).

Specific examples of monoalkylamines include n-hexylamine, n-heptylamine, n-octylamine, n-nonylamine, and n-decylamine.

Specific examples of dialkylamines include diethylamine, di-n-propylamine, di-n-heptylamine, di-n-octylamine, and dicyclohexylamine.

Specific examples of di(alkyl alcohol amines) include diethanolamine, diisopropanolamine, and di-n-octanolamine.

These compounds may be used either alone, or in combinations of two or more compounds.

In the positive resist composition, the amount of the component (D) is typically within a range from 0.01 to 5.0 parts by weight per 100 parts by weight of the component (A), and in terms of achieving a superior effect for the present invention, namely, the effect that enables the formation of a thick-film resist pattern of favorable shape, this amount of the component (D) is preferably within a range from 0.01 to 0.3 parts by weight, and more preferably from 0.01 to 0.2 parts by weight.

<Optional Components>

In a positive resist composition of the present invention, in order to prevent deterioration in the sensitivity, and improve the resist pattern shape and the post exposure stability of the latent image formed by the pattern-wise exposure of the resist layer, at least one compound (E) (hereafter referred to as the component (E)) selected from the group consisting of organic carboxylic acids, and phosphorus oxo acids and derivative thereof may also be added as an optional component.

Examples of the organic carboxylic acids include malonic acid, citric acid, malic acid, succinic acid, benzoic acid, and salicylic acid.

Examples of the phosphorus oxo acids include phosphoric acid, phosphonic acid and phosphinic acid, and of these, phosphonic acid is preferred.

Examples of derivatives of the phosphorus oxo acids include esters formed by substituting the hydrogen atom of an above-mentioned oxo acid with a hydrocarbon group, wherein examples of the hydrocarbon group include alkyl groups of 1 to 5 carbon atoms, and aryl groups of 6 to 15 carbon atoms.

Examples of derivatives of phosphoric acid include phosphate esters such as di-n-butyl phosphate and diphenyl phosphate.

Examples of phosphonic acid or derivatives thereof such as esters include dimethyl phosphonate, di-n-butyl phosphonate, phenylphosphonic acid, diphenyl phosphonate, and dibenzyl phosphonate.

Examples of phosphinic acid or derivatives thereof include phenylphosphinic acid or derivative thereof such as esters.

As the component (E), one type of compound may be used alone, or two or more types of compounds may be used in combination.

As the component (E), an organic carboxylic acid is preferred, and salicylic acid is particularly desirable.

The amount of the component (E) within the positive resist composition is typically within a range from 0.01 to 5.0 parts by weight per 100 parts by weight of the component (A), and in terms of achieving a superior effect for the present invention, namely, the effect that enables the formation of a thick-film resist pattern of favorable shape, this amount of the component (E) is preferably within a range from 0.01 to 0.3 parts by weight, and more preferably from 0.01 to 0.15 parts by weight.

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

In the present invention, including a dissolution inhibitor is particularly preferred in terms of further improving the effect of the present invention, namely, the effect that enables the formation of a thick-film resist pattern of favorable shape. By using a dissolution inhibitor, the difference in the solubility of the exposed portions and the unexposed portions (the solubility contrast) can be enhanced, resulting in more favorable resolution and a better resist pattern shape.

There are no particular restrictions on the dissolution inhibitor, which may be selected appropriately from those compounds proposed as dissolution inhibitors for conventional resist compositions designed for use with KrF excimer lasers or ArF excimer lasers.

Specific examples of the dissolution inhibitor include polyhydric phenol compounds having two or more phenolic hydroxyl groups in which some or all of the hydrogen atoms of the phenolic hydroxyl groups have been substituted with acid dissociable, dissolution inhibiting groups (namely, compounds in which the phenolic hydroxyl groups have been protected with acid dissociable, dissolution inhibiting groups).

Examples of the acid dissociable, dissolution inhibiting groups include the same groups as those described above for the structural unit (a2).

Examples of the polyhydric phenol compound prior to protection of the phenolic hydroxyl groups with acid dissociable, dissolution inhibiting groups include compounds represented by general formula (f-1) shown below.

[Chemical Formula 20]

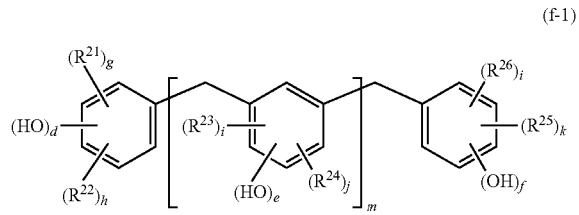

(f-1)

[wherein, $R^{21}$ to $R^{26}$ each independently represents an alkyl group or aromatic hydrocarbon group of 1 to 10 carbon atoms, and these structures may also include a hetero atom; d and g each independently represents an integer of 1 or greater, h represents either 0 or an integer of 1 or greater, and d+g+h is not greater than 5; e represents an integer of 1 or greater, i and j each independently represents either 0 or an integer of 1 or greater, and e+i+j is not greater than 4; f and k each independently represents an integer of 1 or greater, l represents either 0 or an integer of 1 or greater, and f+k+l is not greater than 5; and m is an integer from 1 to 20.]

An alkyl group represented by $R^{21}$ to $R^{26}$ may be a linear, branched or cyclic group, and is preferably a linear or branched lower alkyl group of 1 to 5 carbon atoms, or a cyclic alkyl group of 5 to 6 carbon atoms.

An aromatic hydrocarbon group represented by $R^{21}$ to $R^{26}$ is preferably a group of 6 to 15 carbon atoms, and examples thereof include a phenyl group, tolyl group, xylyl group, mesityl group, phenethyl group or naphthyl group.

The above alkyl groups or aromatic hydrocarbon groups may include a hetero atom such as an oxygen atom, nitrogen atom, or sulfur atom within the structure.

Of these possibilities, compounds in which $R^{21}$ to $R^{26}$ are all lower alkyl groups of 1 to 5 carbon atoms are preferred.

d and g each independently represents an integer of 1 or greater, and preferably an integer from 1 to 2, h represents either 0 or an integer of 1 or greater, and preferably an integer that does not exceed 2, and d+g+h is not greater than 5.

e represents an integer of 1 or greater, and preferably an integer from 1 to 2, i represents either 0 or an integer of 1 or greater, j represents either 0 or an integer of 1 or greater, and preferably an integer that does not exceed 2, and e+i+j is not greater than 4.

f and k each independently represents an integer of 1 or greater, and preferably an integer from 1 to 2, l represents either 0 or an integer of 1 or greater, and preferably an integer that does not exceed 2, and f+k+l is not greater than 5.

m is an integer from 1 to 20, and is preferably from 2 to 10.

Further, as dissolution inhibitors, cross-linking polyvinyl ether compounds can also be mentioned.

Cross-linking polyvinyl ether compounds are compounds having two or more vinyl ether groups in which the oxygen atom of a vinyloxy group ($CH_2$=CH—O—) is bonded to a carbon atom. By including this type of compound, the rectangular formability of the resist pattern can be further improved.

It is thought that the cross-linking polyvinyl ether compound yields the effect described above by functioning as a cross-linker for the component (A). In other words, the cross-linking polyvinyl ether compound undergoes a cross-linking reaction with the component (A) under the action of the heating conducted during the prebake, thereby forming an alkali-insoluble layer across the entire substrate surface. Subsequently, it is thought that the action of the acid generated from the component (B) upon exposure causes degradation of this cross-linking, meaning the exposed portions become alkali-soluble, whereas the unexposed portions remain in an unchanged alkali-insoluble state, thereby improving the solubility contrast.

As the cross-linking polyvinyl ether compound, specific examples thereof include the numerous compounds disclosed in Japanese Unexamined Patent Application, First Publication No. Hei 06-148889 and Japanese Unexamined Patent Application, First Publication No. Hei 06-230574, and any of these compounds may be selected and used. Considering the resist profile shape, which is affected by the heat cross-linking properties and the acid degradation of the cross-linking, and the contrast between the exposed portions and the unexposed portions, compounds obtained by etherifying some or all of the hydroxyl groups of an alcohol represented by general formula (f-2) shown below, by substituting the hydrogen atom of the hydroxyl group with a vinyl group, are preferred.

$$Rb-(OH)_b \quad \text{(f-2)}$$

In general formula (f-2), Rb is a group formed by removing b hydrogen atoms from a linear, branched or cyclic alkane, and may also include a substituent group. Further, an oxygen linkage (an ether linkage) may exist within the alkane.

b represents an integer of 2, 3 or 4.

Specific examples include ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexanedimethanol divinyl ether. Of these compounds, cross-linking divinyl ether compounds are preferred.

As the cross-linking polyvinyl ether compound, compounds represented by general formula (f-3) shown below are also preferred.

$$CH_2=CH-O-R^{27}-O-CH=CH_2 \quad \text{(f-3)}$$

In general formula (f-3), $R^{27}$ is a branched or linear alkylene group of 1 to 10 carbon atoms, or a group represented by general formula (f-4) shown below.

$R^{27}$ may include a substituent group, and further, may include an oxygen linkage (an ether linkage) within its main chain.

[Chemical Formula 21]

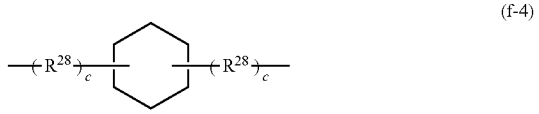

(f-4)

In general formula (f-4), each $R^{28}$ independently represents a branched or linear alkylene group of 1 to 10 carbon atoms which may include a substituent group, wherein the alkylene group may include an oxygen linkage (an ether linkage) within its main chain.

Each c independently represents either 0 or 1.

As the group $R^{27}$, —$C_4H_8$—, —$C_2H_4OC_2H_4$—, —$C_2H_4OC_2H_4OC_2H_4$—, and groups represented by general formula (f-4) are preferred, of these, groups represented by general formula (f-4) are more preferred, and groups of general formula (f-4) in which $R^{28}$ is an alkylene group of 1 carbon atom (namely, a methylene group) and c is 1 (a cyclohexanedimethanol divinyl ether group [hereafter, abbreviated as CHDVE]) are particularly desirable.

The positive resist composition of the present invention can be prepared by dissolving the above materials in an organic solvent (hereafter also referred to as the component (S)).

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl n-amyl ketone, methyl isoamyl ketone and 2-heptanone; polyhydric alcohols such as ethylene glycol, diethylene glycol, propylene glycol and dipropylene glycol, and derivatives thereof; polyhydric alcohol derivatives including compounds with an ester linkage such as ethylene glycol monoacetate, diethylene glycol monoacetate, propylene glycol monoacetate and dipropylene glycol monoacetate, and compounds with an ether linkage including monoalkyl ethers such as the monomethyl ether, monoethyl ether, monopropyl ether or monobutyl ether, or the monophenyl ether of any of the above polyhydric alcohols or the above compounds with an ester linkage; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, amylbenzene, isopropylbenzene, toluene, xylene, cymene, and mesitylene.

These solvents can be used individually, or in combination as a mixed solvent.

Of these solvents, propylene glycol monomethyl ether acetate (PGMEA), propylene glycol monomethyl ether (PGME), and EL are preferred.

Further, a mixed solvent obtained by mixing propylene glycol monomethyl ether acetate (PGMEA) with a polar solvent is preferable. The mixing ratio (weight ratio) of the mixed solvent can be appropriately determined, taking into consideration the compatibility of the PGMEA with the polar solvent, but is preferably from 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Further, in those cases where PGME is used as the polar solvent, the PGMEA:PGME weight ratio is preferably within a range from 1:9 to 9:1, even more preferably from 2:8 to 8:2, and is most preferably from 5:5 to 8:2.

Further, as the component (S), a mixed solvent of at least one of PGMEA, PGME and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a support such as a substrate, depending on the thickness of the coating film. In general, the organic solvent is used in an amount such that the solid content of the resist composition becomes within the range from 2 to 50% by weight, preferably from 10 to 40% by weight, and more preferably from 15 to 40% by weight.

<Thick-Film Resist>

The positive resist composition of the present invention is used for forming a thick-film resist having a film thickness of 1 to 15 μm, and as long as the thick-film resist has a film thickness of not more than 15 μm, a resist pattern of favorable shape can be formed. Further, a resist pattern formed as a thick-film resist having a film thickness of at least 1 μm can be used in a variety of applications, including the MEMS production described below.

The film thickness of the thick-film resist formed using the positive resist composition of the present invention is preferably within a range from 2 to 10 μm, and more preferably from 3 to 8 μm.

The positive resist composition of the present invention can be used favorably within the thick-film resist laminate and the method of forming a resist pattern according to the present invention, both of which are described below.

<<Thick-Film Resist Laminate>>

A thick-film resist laminate of the present invention is prepared by laminating a thick-film resist, having a film thickness of 1 to 15 μm and formed from the above positive resist composition of the present invention on top of a support.

As the support, conventional supports can be used without any particular limitations, and examples include substrates for electronic componentry, as well as substrates on which a predetermined wiring pattern has already been formed. Specific examples of suitable substrates include metal-based substrates such as silicon, silicon nitride, titanium, tantalum, palladium, titanium-tungsten, copper, chrome, iron, aluminum, gold and nickel, as well as glass substrates. Examples of the material for the wiring pattern include copper, solder, chrome, aluminum, nickel and gold.

Further, as the support, a substrate such as those described above having an organic or inorganic antireflective film provided on the surface thereof (namely, between the substrate and the applied layer of the positive resist composition) may also be used.

Even when the surface of the support onto which the thick-film resist is formed is a material described above, the positive resist composition of the present invention is resistant to the occurrence of the footing phenomenon at the interface between the pattern and the support, and yields a resist pattern with excellent shape verticalness.

With the exception of using the positive resist composition of the present invention described above, the production of a thick-film resist laminate according to the present invention can be conducted using conventional methods, and for example, can be produced by applying a solution of the positive resist composition to a support, in sufficient quantity to form a coating film of the desired thickness, and performing a heat treatment (a prebake (or post-apply bake (PAB)) treatment) to remove the organic solvent from within the coating film.

As the method used for applying the solution of the positive resist composition to the support, there are no particular limitations, and methods such as spin coating, slit coating, roll coating, screen printing, or applicator-based methods may be employed.

The conditions for the prebake treatment conducted following application of the positive resist composition of the present invention to the support vary depending on factors such as the nature of the various components within the composition, their relative blend proportions, and the film thickness of the applied coating, but typically involve heating at a temperature of 60 to 150° C. (and preferably from 70 to 140° C.) for a period of 0.5 to 60 minutes (and preferably from 1 to 50 minutes).

The film thickness of the thick-film resist within the thick-film resist laminate is as described above.

<<Method of Forming Resist Pattern>>

The method includes: using an above-mentioned positive resist composition according to the present invention to form a thick-film resist with a film thickness of 1 to 15 μm on a support; selectively exposing the thick-film resist; and subjecting the thick-film resist film to alkali developing to form a resist pattern.

The method of forming a resist pattern according to the present invention may be conducted, for example, in the manner described below.

First, a thick-film resist is formed on top of a support. This step can be conducted using the same method as that described within the above method of producing a thick-film resist laminate.

Subsequently, the thus formed thick-film resist is selectively exposed (for example, by using a KrF exposure apparatus or the like to irradiate KrF excimer laser light through a desired mask pattern, thereby selectively exposing the resist), and PEB (post exposure baking) is then conducted. The conditions for the PEB treatment vary depending on factors such as the nature of the various components within the composition, their relative blend proportions, and the film thickness of the applied coating, but typically involve heating at a temperature of 60 to 150° C. (and preferably from 70 to 140° C.) for a period of 0.5 to 60 minutes (and preferably from 1 to 50 minutes).

The PEB-treated thick-film resist laminate is then developed using an alkali developing solution such as a 0.1 to 10% by weight aqueous solution of tetramethylammonium hydroxide.

In this manner, a resist pattern that is faithful to the mask pattern can be obtained.

The wavelength to be used for the exposure is not particularly limited, and the exposure can be conducted using radiations such as an ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is particularly effective to KrF excimer lasers.

According to the present invention, a resist pattern of favorable shape can be formed in a thick-film resist having a film thickness within a range from 1 to 15 μm.

As a result, a resist pattern obtained in the manner described above exhibits excellent rectangularity, and is very useful as a frame for conducting plating, or a mask for conducting etching. Accordingly, the positive resist composition, thick-film resist laminate and method of forming a resist pattern according to the present invention can be used in all manner of applications.

One such application is the production of MEMS (Micro Electro Mechanical Systems) in which plating steps and/or etching steps are conducted.

As described above, MEMS are highly advanced micro systems in which micromachining techniques are used to integrate a variety of microstructures (including functional elements such as sensors, and conductive structures such as wiring and connection terminals) on top of a substrate.

Specific examples of MEMS include magnetic heads for magnetic recording media, perpendicular magnetic heads, MRAM [(Magnetic Random Access Memory): nonvolatile memory that uses a GMR (giant magnetoresistive) film or TMR (tunnel magnetoresistive) film having a magnetoresistive effect as a memory element], CCD (charge coupled devices), and micro-lenses and the like.

Further, in the production of MEMS, because a variety of etching steps such as the ion milling described below are conducted within the latter stages of production, the resist also requires heat resistance to the heat applied during these steps.

In those cases where a conventional chemically amplified positive resist composition such as that described above is used, heating to a high temperature such as a temperature of 130° C. causes a deterioration in the resist pattern shape due to problems such as heat sag. In contrast, the polymer compound (A1) used in the present invention exhibits excellent heat resistance owing to its high Mw value, and if the structural unit (a3) is included within the polymer compound (A1), then the heat resistance can be further improved. Accordingly, a resist pattern formed using the present invention also exhibits excellent heat resistance, and is therefore very useful within the type of process described above.

Further, the positive resist composition thick-film resist laminate and method of forming a resist pattern according to the present invention enable the formation of a thick-film resist pattern of favorable shape, and are therefore also useful for ion implantation processes.

In the production of semiconductor elements, liquid crystal display elements and MEMS and the like, an impurity diffusion layer is formed on the surface of the support. Formation of this impurity diffusion layer is typically conducted in two stages, namely, impurity introduction, and diffusion. One example of a method of performing the impurity introduction is an ion implantation process (hereafter, referred to as simply implantation) in which an impurity such as phosphorus or boron is ionized within a vacuum, and then accelerated by a strong electric field and driven into the surface of the support.

The resist pattern is used as a mask when the impurity ions are driven selectively into the support surface by implantation. As a result, the resist pattern used in the implantation process requires excellent shape properties, so that the ions can be implanted within the desired areas of the support. Particularly in the case of a resist pattern used within a high-energy implantation process, which is conducted at a higher level of energy than normal implantation processes, the resist film must be thick enough to exhibit satisfactory resistance to the implantation process.

However, as described above, when a resist pattern is formed within a thick-film resist formed using a conventional chemically amplified resist composition, the resist pattern tends to suffer from poor shape.

In contrast, because the present invention enables the formation of a thick-film resist pattern of favorable shape, it is very useful for implantation processes, and particularly for high-energy implantation processes.

One example of a MEMS production process using the present invention is described below with reference to FIG. 1A through FIG. 1C.

Figure 1B:
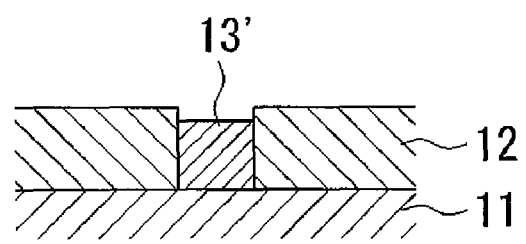
FIG. 1B A schematic illustration showing a process for forming a magnetic film pattern using a plating method in which a resist pattern is used as a frame, the figure describing a step of forming a plating film by conducting plating within the trench portion (the concave portion) surrounded by the resist pattern.
Figure 1C:
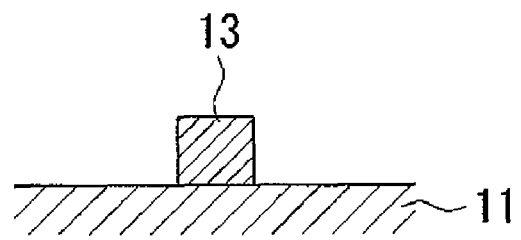
FIG. 1C A schematic illustration showing a process for forming a magnetic film pattern using a plating method in which a resist pattern is used as a frame, the figure describing a step of obtaining a magnetic film pattern by removing the resist pattern.

FIG. 1A through FIG. 1C are schematic illustrations (side sectional views) showing each of the steps in the production of the write unit (the head unit used for writing) of a magnetic head.

As shown in FIG. 1A to FIG. 1C, in the production steps for the write unit of a magnetic head of a magnetic recording medium, a technique can be used in which a narrow trench-shaped resist pattern is formed, and plating is then conducted using this resist pattern as a frame, thereby forming a fine magnetic film pattern.

Specifically, first, as shown in FIG. 1A, a plating seed layer 11 is formed on the upper surface of a base material (not shown in the figures) prepared by forming a desired laminate structure on top of a substrate, and a conventional lithography process is then used to form a slit-shaped resist pattern 12 with a substantially rectangular cross-section on top of the seed layer.

Subsequently, as shown in FIG. 1B, plating is performed within the trench portion (concave portion) surrounded by the resist pattern 12, thus forming a magnetic film 13'.

Finally, as shown in FIG. 1C, the resist pattern 12 is removed, yielding a magnetic film pattern 13 having a rectangular cross-section.

EXAMPLES

As follows is a more detailed description of the present invention based on a series of examples and comparative examples, although the scope of the present invention is in no way limited by these examples.

The materials used in the following examples and comparative examples are shown below.

[Component (A)]

(A)-1: a copolymer of general formula (1) shown below, in which $x^1:y^1:z^1=66.5:8.5:25$ (molar ratio), Mw=22,000, and Mw/Mn=2.1.

(A)-2: a copolymer of general formula (2) shown below, in which $x^1:y^1:z^1=60:15:25$ (molar ratio), Mw=12,000, and Mw/Mn=2.1.

(A)-3: a copolymer of general formula (3) shown below, in which $x^3:y^3=75:25$ (molar ratio), Mw=11,000, and Mw/Mn=1.5.

(A)-4: a copolymer of general formula (4) shown below, in which $x^4:y^4=62:38$ (molar ratio), Mw=18,000, and Mw/Mn=1.5.

[Chemical Formula 22]

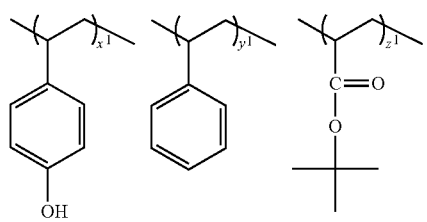

(1.2)

[Chemical Formula 23]

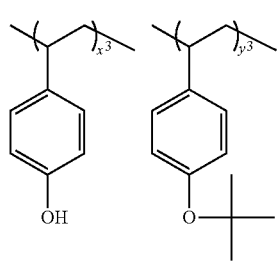

(3)

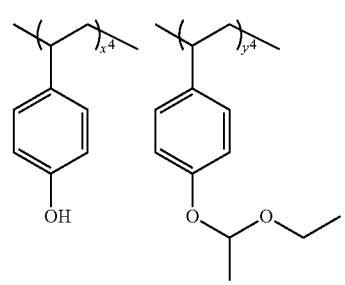

(4)

[Component (B)]

(B)-1 through (B)-6: compounds represented by the respective chemical formulas shown below.

[Chemical Formula 24]

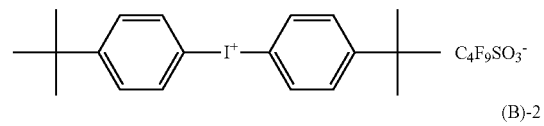

(B)-1

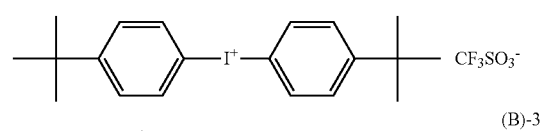

(B)-2

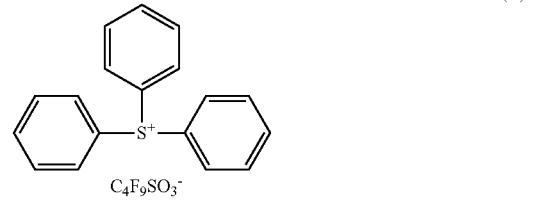

(B)-3

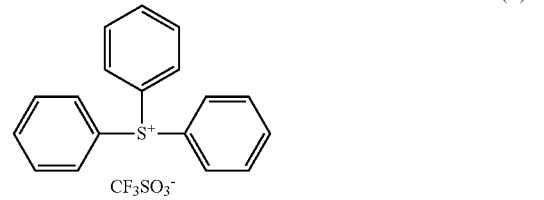

(B)-4

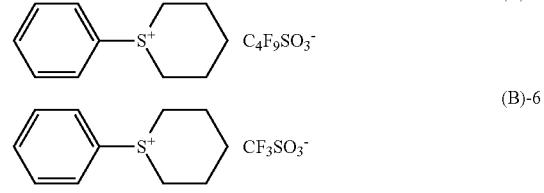

(B)-5

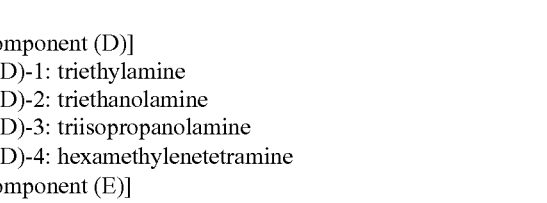

(B)-6

[Component (D)]
 (D)-1: triethylamine
 (D)-2: triethanolamine
 (D)-3: triisopropanolamine
 (D)-4: hexamethylenetetramine
[Component (E)]
 (E)-1: salicylic acid
[Other Components]
 DI-22: a compound shown below
 CHDVE: a compound shown below

[Chemical Formula 25]

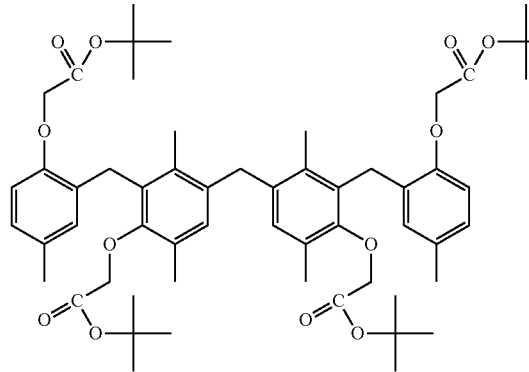

DI-22

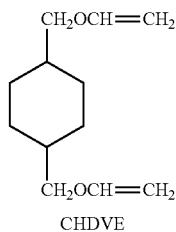

CHDVE

Examples 1 to 8, Comparative Examples 1 to 8

Each of the components shown in Tables 1 to 5 were mixed with, and dissolved in, a mixed solvent of PGME and PGMEA (mixing ratio 8:2) as the component (S), thus yielding a series of positive resist compositions having a solid fraction concentration of 28% by weight.

In the Tables 1 to 5, the units for the blend quantities shown inside the brackets [ ] are parts by weight.

TABLE 1

|  | Component (A) [blend quantity] | Component (B) [blend quantity] | Component (D) [blend quantity] | Component (E) [blend quantity] | PAB temperature (° C.) | PEB temperature (° C.) |
| --- | --- | --- | --- | --- | --- | --- |
| Example 1 | (A)-1 [100] | (B)-1 [2] | (D)-1 [0.068] | (E)-1 [0.09] | 140 | 110 |
| Comparative example 1 | (A)-2 [100] | (B)-1 [2] | (D)-1 [0.068] | (E)-1 [0.09] | 140 | 110 |
| Comparative example 2 | (A)-3 [100] | (B)-1 [2] | (D)-1 [0.068] | (E)-1 [0.09] | 140 | 110 |
| Comparative example 3 | (A)-4 [100] | (B)-1 [2] | (D)-1 [0.068] | (E)-1 [0.09] | 110 | 100 |

TABLE 2

|  | Component (A) [blend quantity] | Component (B) [blend quantity] | Component (D) [blend quantity] | Component (E) [blend quantity] | PAB temperature (° C.) | PEB temperature (° C.) |
| --- | --- | --- | --- | --- | --- | --- |
| Comparative example 4 | (A)-1 [100] | (B)-2 [2] | (D)-1 [0.068] | (E)-1 [0.09] | 140 | 110 |
| Example 2 | (A)-1 [100] | (B)-3 [2] | (D)-1 [0.068] | (E)-1 [0.09] | 140 | 110 |
| Comparative example 5 | (A)-1 [100] | (B)-4 [2] | (D)-1 [0.068] | (E)-1 [0.09] | 140 | 110 |
| Example 3 | (A)-1 [100] | (B)-5 [2] | (D)-1 [0.068] | (E)-1 [0.09] | 140 | 110 |
| Comparative example 6 | (A)-1 [100] | (B)-6 [2] | (D)-1 [0.068] | (E)-1 [0.09] | 140 | 110 |

TABLE 3

|  | Component (A) [blend quantity] | Component (B) [blend quantity] | Component (D) [blend quantity] | Component (E) [blend quantity] | PAB temperature (° C.) | PEB temperature (° C.) |
| --- | --- | --- | --- | --- | --- | --- |
| Example 4 | (A)-1 [100] | (B)-1 [2] | (D)-2 [0.068] | (E)-1 [0.09] | 140 | 110 |
| Example 5 | (A)-1 [100] | (B)-1 [2] | (D)-3 [0.068] | (E)-1 [0.09] | 140 | 110 |
| Comparative example 7 | (A)-1 [100] | (B)-1 [2] | (D)-4 [0.068] | (E)-1 [0.09] | 140 | 110 |

TABLE 4

|  | Component (A) [blend quantity] | Component (B) [blend quantity] | Component (D) [blend quantity] | Component (E) [blend quantity] | Other component [blend quantity] | PAB temperature (° C.) | PEB temperature (° C.) |
| --- | --- | --- | --- | --- | --- | --- | --- |
| Example 6 | (A)-1 [100] | (B)-1 [2] | (D)-1 [0.068] | (E)-1 [0.09] | DI-22 [5.0] | 140 | 110 |
| Example 7 | (A)-1 [100] | (B)-1 [2] | (D)-1 [0.068] | (E)-1 [0.09] | CHDVE [5.0] | 140 | 110 |

TABLE 5

|  | Component (A) [blend quantity] | Component (B) [blend quantity] | Component (D) [blend quantity] | Component (E) [blend quantity] | PAB temperature (° C.) | PEB temperature (° C.) |
| --- | --- | --- | --- | --- | --- | --- |
| Example 8 | (A)-1 [100] | (B)-1 [1] | (D)-1 [0.034] | (E)-1 [0.045] | 140 | 110 |

[Evaluation of Resist Pattern Shape]

Each of the positive resist compositions obtained above was applied, using a spinner, to the surface of a Si substrate that had been surface treated with hexamethyldisilazane (HMDS), and the composition was then prebaked and dried on a hotplate for 150 seconds at a temperature indicated in Tables 1 to 5, thereby forming a resist film with a film thickness of 5,000 nm.

This film was then selectively irradiated with a KrF excimer laser (248 nm) through a (binary) mask, using a KrF exposure apparatus NSR-S203B (manufactured by Nikon Corporation, NA (numerical aperture)=0.55, σ=0.49).

Subsequently, a PEB treatment was conducted for 150 seconds at a temperature indicated in Tables 1 to 5, and the resist film was then developed for 120 seconds at 23° C. in a 2.38% by weight aqueous solution of tetramethylammonium hydroxide, and then rinsed by washing for 30 seconds with pure water. The resist was then shaken dry, and then further dried by heating at 100° C. for 60 seconds, thus forming a resist pattern.

The substrate with the resist pattern formed thereon in the above manner was inspected using a scanning electron microscope (SEM).

The results revealed that, for each of the examples 1 to 8, a line and space (L/S) pattern with a line width of 750 nm and a pitch of 1,500 nm had been resolved.

Further, by comparing the example 1 with the comparative examples 1 to 3 in which the nature of the component (A) had been altered, it is evident that the example 1, which used a copolymer (A)-1 corresponding with the polymer compound (A1), exhibited a high degree of verticalness of the pattern side walls, and formed a L/S pattern with a cross-sectional shape of superior rectangular formability.

In contrast, in the comparative example 1, which used a copolymer (A)-2 having the same structural units as the copolymer (A)-1, but with a molecular weight of less than 20,000, the resist pattern shape was rounded at the top portions, and the pattern side walls displayed a slight taper shape. Further, thickness loss also occurred.

In the comparative example 2 which used the copolymer (A)-3, the cross-sectional shape displayed footing, and the top portions of the pattern were also rounded.

In the comparative example 3 which used the copolymer (A)-4, the cross-sectional shape displayed footing and the top portions of the pattern were rounded, with the central portions of the pattern being narrower.

By comparing the examples 1 to 3 with the comparative examples 4 to 6, in which the nature of the component (B) had been altered, it is evident that the examples 1, 2 and 3, which used the compounds (B)-1, (B)-3 and (B)-5 respectively, each of which contained a nonafluorobutanesulfonate ion ($C_4F_9SO_3^-$) as the anion moiety, all exhibited a high degree of side wall verticalness, with superior rectangular formability.

In contrast, the comparative examples 4, 5 and 6, which used the compounds (B)-2, (B)-4 and (B)-6 respectively, each of which contained a trifluoromethanesulfonate ion ($CF_3SO_3^-$) as the anion moiety, all generated a resist pattern in which the cross-sectional shape displayed footing and the upper portion of the pattern was extremely narrow.

By comparing the examples 1, 4 and 5, with the comparative example 7, in which the nature of the component (D) had been altered, it is evident that the examples 1, 4 and 5, which used a chainlike tertiary aliphatic amine, all exhibited a high degree of side wall verticalness, and generated a cross-sectional shape with superior rectangular formability. Among these examples, the shape was more favorable for those compositions in which the molecular weight of the tertiary aliphatic amine used was smaller.

In contrast, the comparative example 7, which used a cyclic amine, displayed rounding of the top portions of the pattern.

Further, comparison of the examples 1, 6 and 7 reveals that although all exhibited favorable shapes, the example 6 which also includes added DI-22, and the example 7 which includes added CHDVE, displayed an even more favorable shape than the example 1, and the shape of the example 7 was particularly favorable, with an extremely high degree of rectangular formability.

Furthermore, comparison of the examples 1 and 8 reveals that the example 8, in which the blend quantities of the component (B), the component (D) and the component (E) were half those used in the example 1, exhibited a more favorable shape, with a higher degree of rectangular formability.

INDUSTRIAL APPLICABILITY

According to the present invention, there are provided a positive resist composition for forming a thick-film resist, which is capable of forming a thick-film resist pattern of favorable shape, and a thick-film resist laminate and method of forming a resist pattern that use this positive resist composition.

The invention claimed is:

1. A positive resist composition for forming a thick-film resist having a film thickness of 1 to 15 μm, said composition comprising:
    a resin component (A) that comprises acid dissociable, dissolution inhibiting groups and exhibits increased alkali solubility under action of acid, an acid generator component (B) that generates acid upon exposure, a nitrogen-containing organic compound (D), and a dissolution inhibitor which is a cross-linking polyvinyl ether compound, wherein
    said resin component (A) is a polymer compound (A1) with a weight average molecular weight of 20,000 to 50,000, comprising a structural unit (a1) derived from a hydroxystyrene, and a structural unit (a2) derived from an acrylate ester containing an acid dissociable, dissolution inhibiting group,
    said acid generator component (B) comprises an onium salt-based acid generator having an anion moiety represented by a general formula (I): $R^{4'''}SO_3^-$ (wherein, $R^{4'''}$ represents a linear or branched alkyl group of 4 carbon atoms, or a linear or branched fluoroalkyl group of 4 carbon atoms), wherein said onium salt-based acid generator comprises an acid generator (b-0) represented by general formula (b-0) shown below:

[Chemical Formula 1]

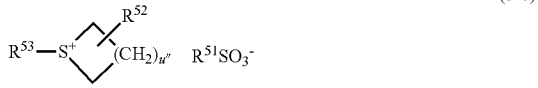
(b-0)

[wherein, $R^{51}$ represents a linear or branched alkyl group or fluoroalkyl group of 4 carbon atoms; $R^{52}$ represents a hydrogen atom, a hydroxyl group, a halogen atom, a linear or branched alkyl group, a linear or branched haloalkyl group, or a linear or branched alkoxy group; $R^{53}$ represents an aryl group that may include a substituent group; and u" represents an integer from 1 to 3], and
    said nitrogen-containing organic compound (D) comprises a chain-like tertiary aliphatic amine.

2. A positive resist composition according to claim 1, wherein said resin component (A) further comprises a structural unit (a3) derived from a styrene.

3. A thick-film resist laminate comprising a thick-film resist with a film thickness of 1 to 15 μm formed from a positive resist composition according to claim 1 laminated on top of a support.

4. A method of forming a resist pattern, comprising: using a positive resist composition according to claim 1 to form a thick-film resist with a film thickness of 1 to 15 μm on a support; selectively exposing said thick-film resist; and subjecting said thick-film resist film to alkali developing to form a resist pattern.

* * * * *